United States Patent [19]

Kysiak

[11] Patent Number: 4,655,535
[45] Date of Patent: Apr. 7, 1987

[54] JACK MODULE AND JACKFIELD

[75] Inventor: William J. Kysiak, Brookfield, Ill.

[73] Assignee: Switchcraft, Inc., Chicago, Ill.

[21] Appl. No.: 740,441

[22] Filed: Jun. 3, 1985

[51] Int. Cl.⁴ .............................................. H01R 13/50
[52] U.S. Cl. ............................. 339/182 R; 339/17 C; 339/183; 339/19
[58] Field of Search .............. 339/221 R, 221 M, 182, 339/183, 17 C, 17 LC, 19, 17, 17 M, 198 R, 198 G, 198 GA, 198 H, 196 M, 258 R; 200/51.1, 51.12, 51.04

[56] References Cited

U.S. PATENT DOCUMENTS

| | | | |
|---|---|---|---|
| 3,107,965 | 10/1963 | Solorow et al. | 339/258 R |
| 3,627,942 | 12/1971 | Bobb | 339/196 M |
| 3,871,728 | 3/1975 | Goodman | 339/19 |
| 4,165,147 | 8/1979 | Buck | 339/17 C |
| 4,401,351 | 8/1983 | Record | 339/17 M |
| 4,425,018 | 1/1984 | Stenz | 339/198 GA |
| 4,439,809 | 3/1984 | Weight et al. | 339/17 M |
| 4,548,447 | 10/1985 | Dinsmore | 339/182 R |

FOREIGN PATENT DOCUMENTS 3119218 12/1982 Fed. Rep. of Germany ...... 339/183

Primary Examiner—Gil Weidenfeld
Assistant Examiner—David L. Pirlot
Attorney, Agent, or Firm—John T. Meaney; R. M. Sharkansky

[57] ABSTRACT

A jackfield assembly comprising a linear array of electrical jack modules disposed along a longitudinal marginal portion of a printed circuit having a conforming array of apertured areas, each of which includes a predetermined pattern of through-apertures disposed for receiving therein respective wire terminals protruding from a proximal supporting surface of a respective one of the modules for electrical connection to a printed circuit conductor provided on the board. Also, each of the apertured areas includes a through-hole suitably located for receiving a snug-fitting post also extending from the proximal supporting surface of a respective one of the module. Each of the modules has a distal surface provided with a plurality of protruding stubs over which are press-fitted respective through-holes in a rigid interlocking strip which prevents rotational or racking movement of one of the modules relative to the other modules in the array. The modules have respective aligned end surfaces from which protrude a plurality of plug-receiving collars slidably extended through respective apertures in a rigid front panel for preventing lifting movement of one of the modules relative to the other modules in the array.

4 Claims, 46 Drawing Figures

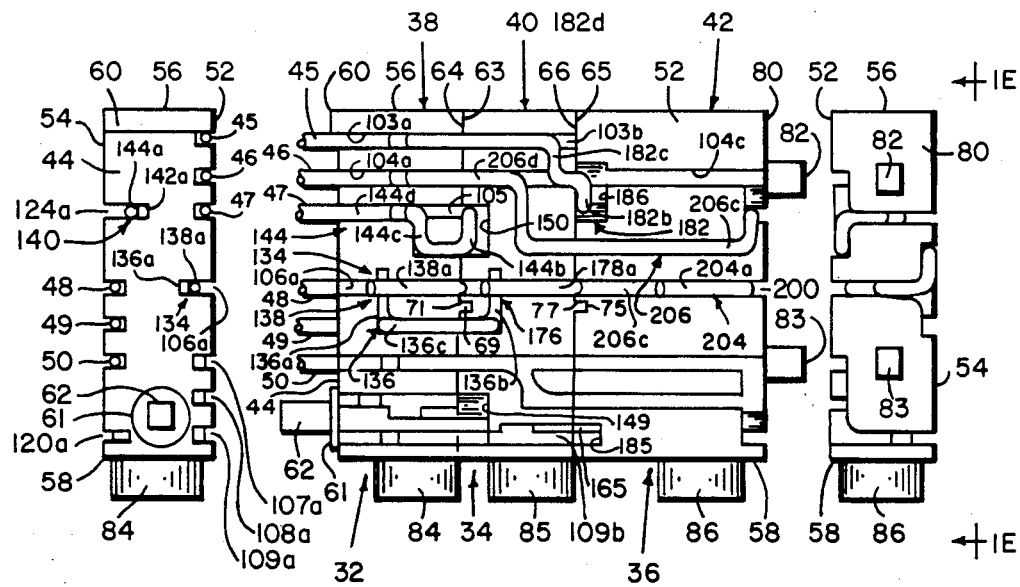
FIG.1C  FIG.1B  FIG.1D
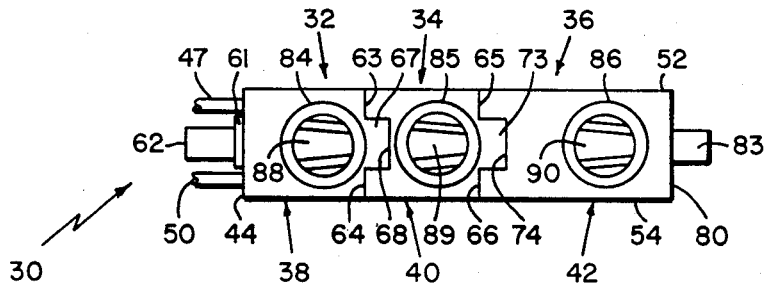
FIG. 1A
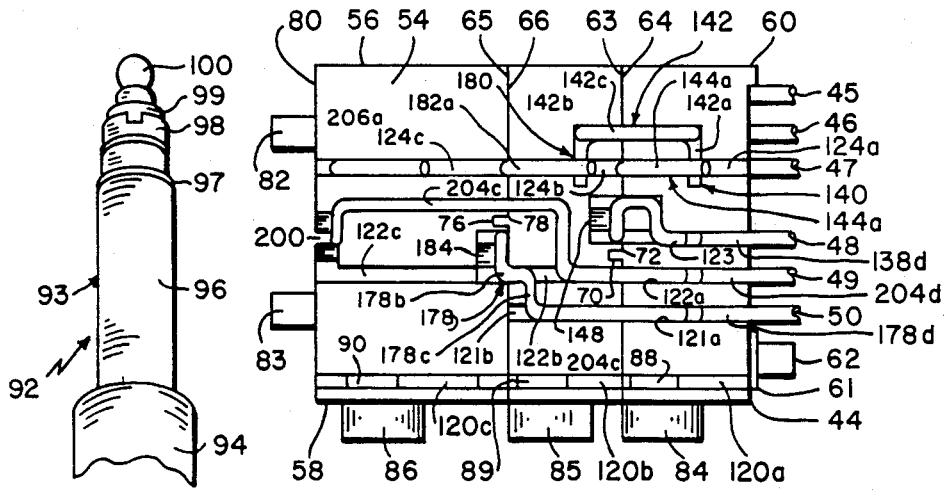
FIG. 2
PRIOR ART
FIG.1E

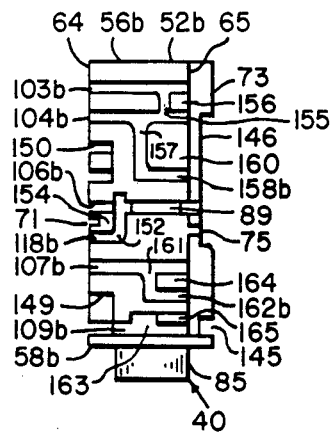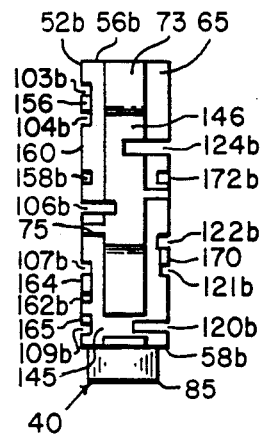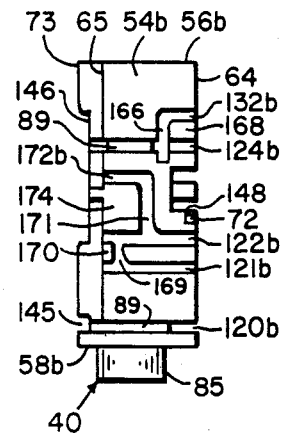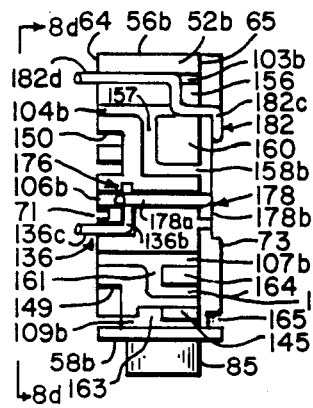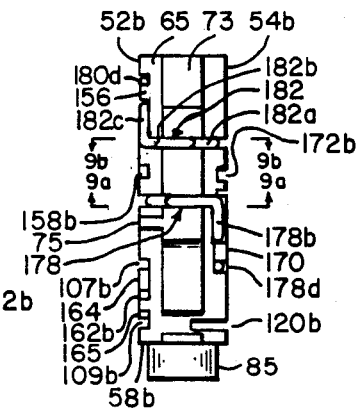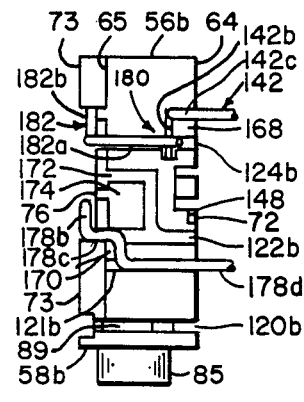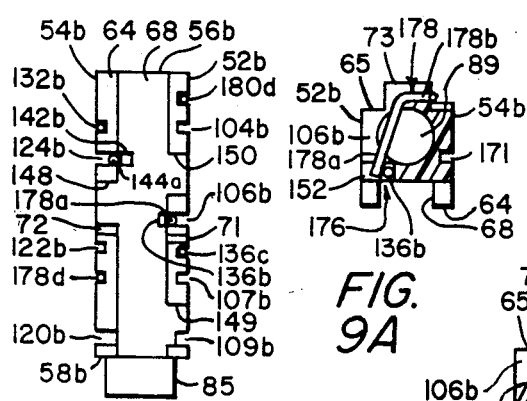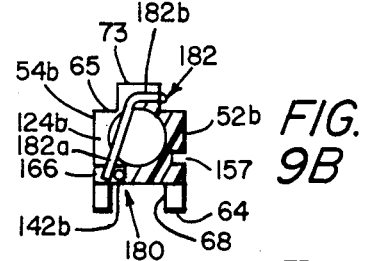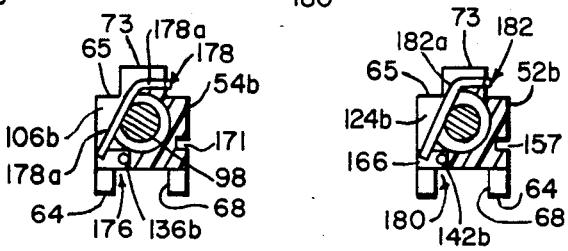

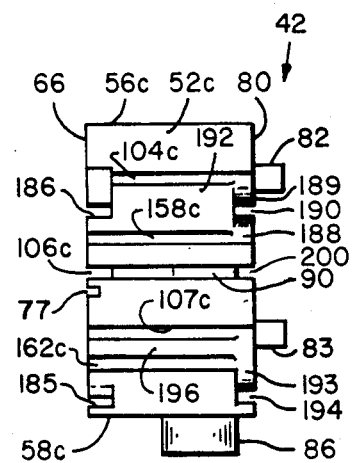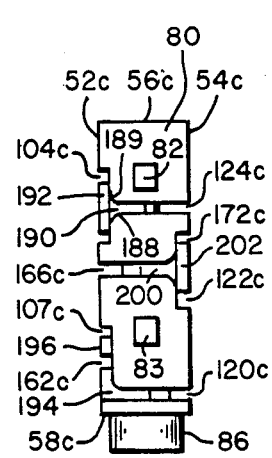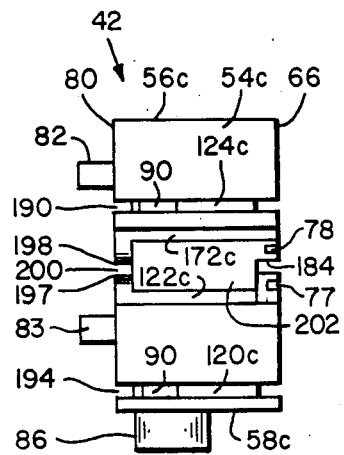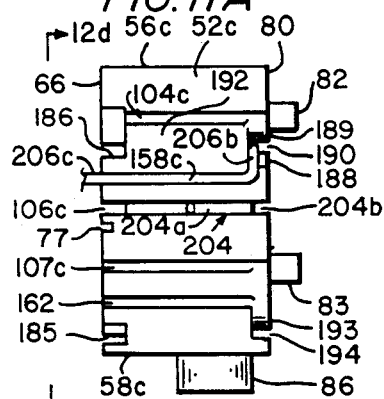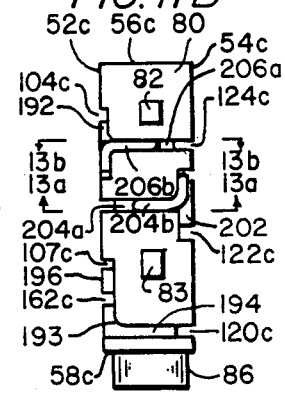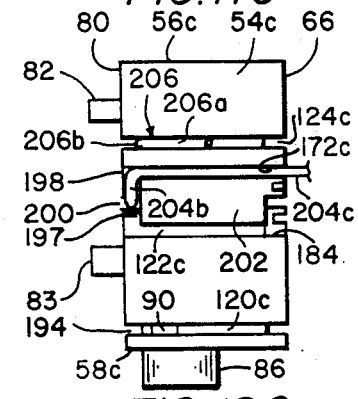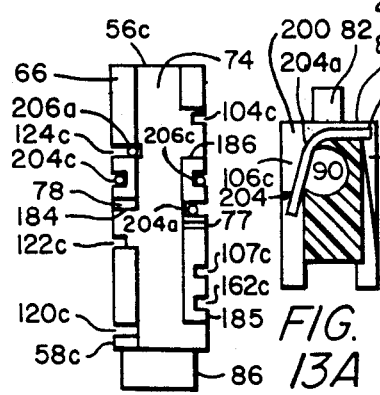

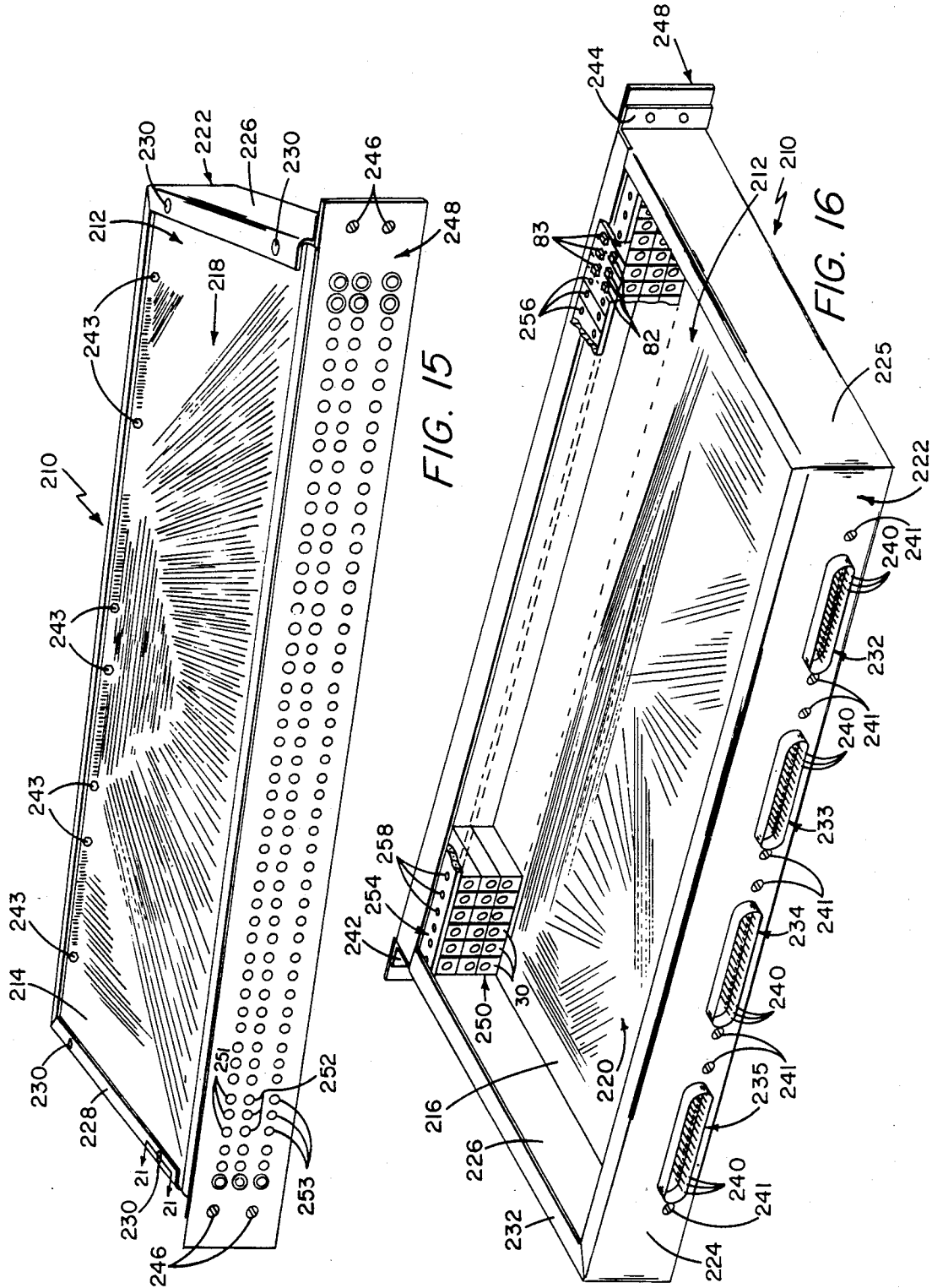

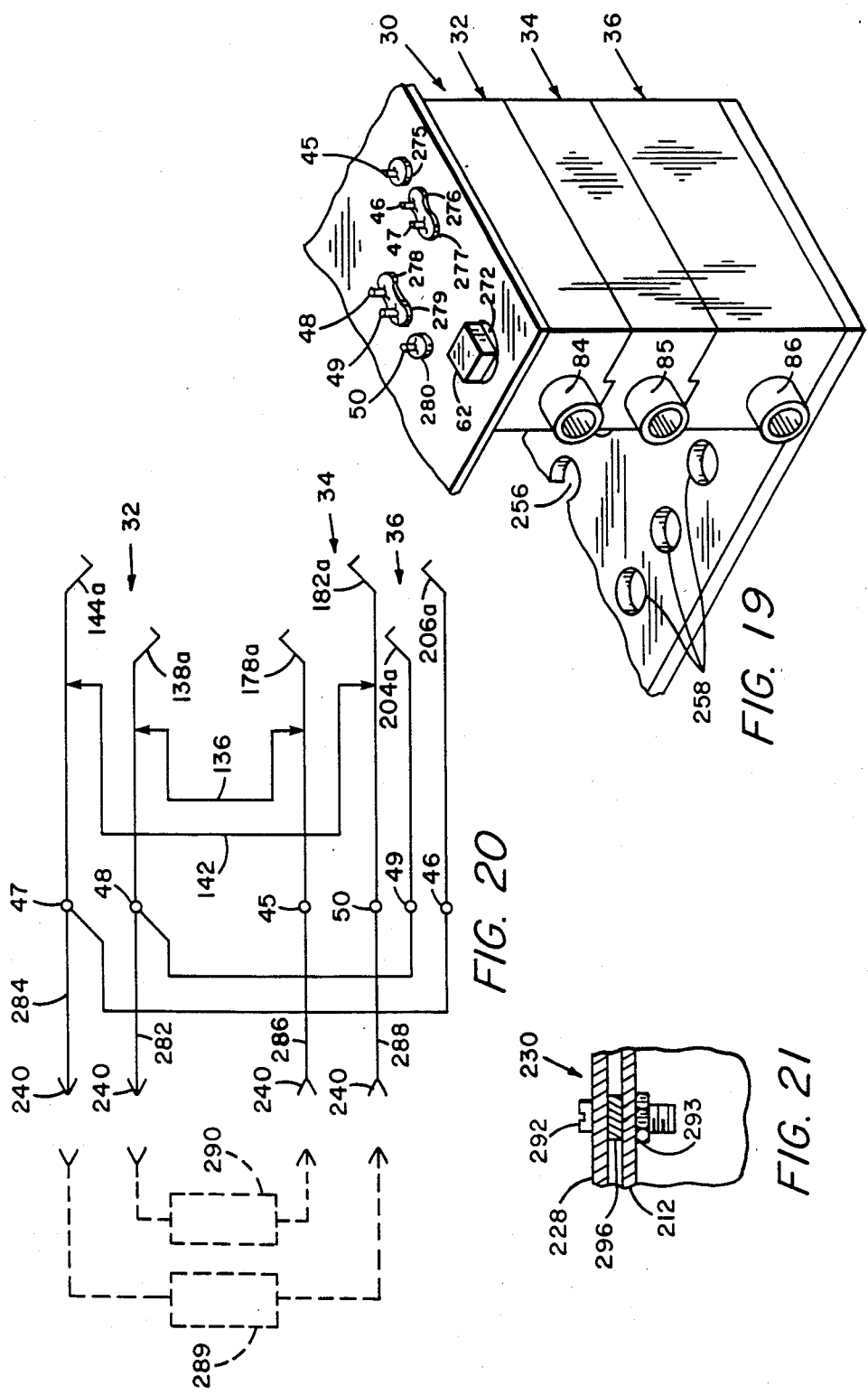

JACK MODULE AND JACKFIELD

CROSS-REFERENCE TO RELATED APPLICATION

Reference is hereby made to copending U.S. patent application Ser. No. 584,261 filed on Feb. 27, 1984 and assigned to the same assignee.

BACKGROUND OF THE DISCLOSURE

1. Field of the Invention

This invention relates generally to electrical jacks adaptable for connection into jackfield assemblies and is concerned more particularly with an electrical jack module having integral means for simplifying connection of the module into a jackfield assembly.

2. Discussion of the Prior Art

A jackfield assembly of the prior art may include a rectangular frame defining an opening wherein a linear array of laterally spaced, electrical jack modules extends in cantilever fashion from a longitudinal side of the frame. Each of the modules may comprise a metal tee-bracket having a cross member fastened, as by screws, for example, to the frame and having an orthogonal leg member supporting in vertically stacked relationship a plurality of electrical jack devices of the metal leafspring type. Each of the electrical jack devices may include a plurality of vertically stacked contact members, alternate contact members being moveable relative to interposed fixed contact members and having respective cam portions aligned with a plug-receiving aperture in the module-supporting side of the frame. Thus, a cylindrical probe type of electrical jack plug may be inserted axially into any one of the apertures in the module-supporting side of the frame for interference engagement with the aligned cam portions of respective movable contact members to move them relative to the adjacent fixed contact members of the associated electrical jack device.

The contact members of the electrical jack devices in each of the modules may be electrically connected to respective prong-like terminals which protrude from the distal end portion of the module. These prong-like terminals may be electrically connected, as by wire-wrapping, for example, to stripped end portions of respective wires in an umbilical wire harness disposed sinuously in the opening defined by the frame. The wires in the umbilical wire harness may have opposing end portions connected electrically through respective terminals of harness connector devices to respective mating terminals of feed-through connector devices mounted in the other longitudinal side of the frame. Thus, the electrical jack plug, which is inserted into an aperture in the module-supporting longitudinal side of the frame to cause movement of moveable contact members relative to adjacent fixed contact members, may be used to open, close or patch into electrical circuitry connected to respective terminals of the feed-through connector devices mounted in the other longitudinal side of the frame.

However, as the requirements for circuit density have increased, more electrical jack modules have been added to the linear array until they may number as much as forty-eight modules which are laterally spaced from one another in the array. This increase in modules has caused a corresponding increase in the number of prong-like terminals and a similar increase in the number of connecting wires in the umbilical wire harness. Consequently, it has been necessary to increase the number of harness connector devices having respective terminals connected to other end portions of the wires in the wire harness and to increase similarly the number of feed-through connector devices mounted in the other longitudinal side of the frame.

As a result of this increase in modules, each of which includes a metal tee-bracket having a cross member fastened, as by screws, for example, to the frame and an orthogonal leg member supporting a vertically stacked plurality of electrical jack devices of the metal leafspring type, the weight of the assembly has been increased considerably. Moreover, the resulting increase of prong-like terminals connected by wire-wrapping to stripped end portions of respective wires in the umbilical wire harness has increased the possibility of errors occurring during the wire-wrapping phase of fabrication and, therefore, has decreased reliability of the assembly process. Also, the additional wires, which are of the solid type for wire-wrapping purposes, and the additional connectors required for the umbilical wire harness have added significant weight to the overall assembly. Consequently, this heavier jackfield assembly may be found cumbersome during removal from equipment and in handling, as during trouble-shooting procedures, for example. Furthermore, the weight of the overall assembly when multiplied by the number of these heavier assembles installed in a piece of equipment have added substantially to the shipment costs of the equipment.

SUMMARY OF THE INVENTION

Accordingly, these and other disadvantages of the prior art are overcome by providing a relatively lightweight, electrical jack module with integral means for simplifying connection of the module into an assembly, and a comparatively lightweight jackfield assembly with module interconnecting means for connecting an array of said modules into the jackfield assembly without requiring separate fastening hardware for the respective modules in the array.

This electrical jack module comprises a vertically stacked series of electrical jacks having respective block-like housings of dielectric material oriented similarly and interfitted with one another to form a slab-like body having a uni-structural appearance. The module has opposing top and bottom surfaces, one of which comprises a common terminal surface and the other of which comprises an attitude control surface of the module. Protruding from the common terminal surface is a predetermined pattern of wire terminals and an integral orientation-post which constitutes a first restraining means of the module. Protruding integrally from the opposing attitude control surface is a plurality of mutually spaced, movement restricting stubs which constitute a second restraining means of the module. Protruding from an end surface of the module is a plurality of mutually spaced collars equal in number to the number of electrical jacks in the vertically stacked series and constituting a third restraining means of the module. Each of the collars extends integrally from an end surface of a respective housing and encircles an open or entrance end of a bore disposed axially in the housing for receiving a slidably inserted, electrical jack plug of the conventional type.

The wire terminals protruding from the terminal surface of the module comprise integral end portions of respective spring wires which are pre-shaped for press-fitting into grooves disposed in the longitudinal side surfaces of the module. Each of the spring wires has an integral elbow portion disposed for resisting insertion or withdrawal forces exerted on the associated wire terminal and has an integral bight portion disposed for extending across a distal surface of a preselected housing toward the opposing longitudinal side surface thereof. Also, each of the spring wires has an integral other end portion constituting a movable contact member which extends through a marginal portion of the bore in said preselected housing and terminates in a bore-communicating groove disposed in said other longitudinal side surface of the preselected housing. All of the movable contact members are resiliently biased for interference engagement with said electrical jack plug slidably inserted into the associated bore of the preselected housing.

Some of the resiliently biased, movable contact members normally are disposed in pressure electrical engagement with fixed contact members of respective electrical switches embedded in the longitudinal side surfaces of the module. Each of the fixed contact members comprises an integral end portion of a shunt wire having an intermediate portion electrically connected to another integral end portion of the wire constituting a fixed contact member of an electrical switch embedded in the same longitudinal side surface of the module. The shunt wires are pre-shaped for press-fitting into grooves disposed in the longitudinal side surfaces of the module. As a result, the shunt wires are embedded in the material of the longitudinal side surfaces with sufficient snuggness for providing the necessary frictional engagement to hold the shunt wires firmly in place even during operation of the associated switches. Thus, the shunt wires constitute an integral means for simplifying connection of the module into an assembly by connecting two fixed contact members of respective electrical switches directly to one another on the module, without employing conventional interconnecting techniques, such as soldering, welding, or crimping, for examples.

This jackfield assembly comprises an array of said modules and module interconnecting means for connecting each of the modules into the assembly without the need of separate fastening hardware for the respective modules. The interconnecting means includes a first interconnecting member comprising a printed circuit board having an array of apertured areas conforming to the array of modules. Each of the apertured areas includes a predetermined pattern of through-apertures and a suitably located through-hole for receiving the wire terminals and the orientation-post, respectively, extending from the terminal surface of a respective module in the array. The through-apertures have respective defining wall surfaces plated with electrically conductive material and connected electrically to printed circuit conductors disposed on the extended surfaces of the printed circuit board.

Each of the plated through-apertures is sized to provide sufficient clearance for the received wire terminal to pass readily through it and for permitting a fillet of solder to be disposed, as by wave-soldering, for example, between the wire terminal and the plated wall surfaces of the aperture. On the other hand, each of the through-holes is suitably sized and configured for providing a snug fit for the received orientation post. Thus, a laterally directed force, such as exerted on the associated module when the electrical jack plug is slidably inserted into the bore in a housing, for example, is resisted by the snuggly fitting orientation-post to prevent damage to the soldered electrical connections formed between the wire terminals and the electrical conductors of the printed circuit board.

Thus, it may be seen that the printed circuit board not only provides a weight reduction advantage but also connects the terminals of the respective modules electrically to printed circuit conductors in the assembly with greater reliability, as compared to prior art means, such as wirewrapping stripped end portions of solid wire conductors to respective terminals of the modules, for example. Also, it may be seen that the first interconnecting member comprising the printed circuit board cooperates with the first restraining means comprising the orientation-posts of the respective modules to retain each of the modules in position in the array against laterally directed forces exerted on the terminal surfaces of the modules.

The interconnecting means also includes a second interconnecting member comprising a module interlocking strip of rigid material spanning the attitude control surfaces of all the modules in the array. Portions of the module interlocking strip aligned with respective modules in the array are provided with respective pluralities of mutually spaced through-holes, each of which receives a respective movement-restricting stub protruding from the altitude control surface of the aligned module. These stub receiving through-holes are suitably sized and configured for press-fitting over the received stub, such that the module interlocking strip is firmly secured to the spanned attitude control surfaces of the respective modules in the array. Thus, when an electrical jack is slidably inserted into a bore of an electrical jack housing, such as the housing of the vertically stacked jack most distal from the printed circuit board, for example, there may be developed a resulting torque which tends to rock or rotate the module, particularly if the electrical jack plug is wriggled laterally during insertion or removal, for example. This tendency to rock or rotate the module, which may damage the electrical connections of the wire terminals to the printed circuit conductors on the board, is resisted by the module interlocking strip utilizing the rigidity of its material and the stability of the other modules in the array to overcome the tendency. Accordingly, it may be seen that the second interconnecting member comprising the module interlocking strip cooperates with the second restraining means comprising the move- ment-restricting stubs protruding from the altitude control surfaces of the respective modules to retain each of the modules in the proper position in the array against rocking or rotating forces exerted on a particular module.

The interconnecting means includes a third interconnecting member comprising a rigid panel spanning the end surfaces of modules having protruding therefrom respective pluralities of mutually spaced collars. Portions of the panel aligned with respective modules of the array are provided with respective pluralities of mutually spaced through-holes, each of which is located and sized for sliding over an aligned one of the plurality of collars protruding from the end surface of the aligned module. As a result, the rigid panel is brought into interfacing relationship with the adjacent end surfaces of the modules which are supported on the printed circuit board. The printed circuit board is secured into a frame member of the assembly wherein the rigid panel slidably installed over the collars has opposing end portions fastened to the frame member and may comprise a side of the frame member. Thus, when an electrical jack plug is slidably inserted through one of the collars and into the aligned bore of a housing, it may be wiggled in a manner which tends to lift the adjacent end portion of the module away from the printed circuit board and possibly withdraw the orientation-post of the module from the aligned through-hole in the printed circuit board. However, this tendency to lift the adjacent end portion of the module is resisted by the rigid panel which holds the adjacent end portions of the modules in predetermined laterally spaced relationship with one another and firmly on the printed circuit board to prevent damage to the electrical connection of the wire terminals with conductors of the printed circuit board. Accordingly, it may be seen that the third interconnecting member comprising the rigid panel cooperates with the third restraining means comprising the pluralities of mutually spaced collars protruding from adjacent end surfaces of the respective modules to retain each of the modules in position in the array and connected to the printed circuit board of the assembly.

BRIEF DESCRIPTION OF THE DRAWINGS

For a better understanding of this invention, reference is made in the following detailed description to the accompanying drawings wherein:

FIG. 1A is an elevational end view of an electrical jack module embodying the module features of this invention;

FIG. 1B is an elevational side view of the module shown in FIG. 1A;

FIGS. 1C and 1D are plan views of the terminal surface and the opposing distal surface, respectively, of the module shown in FIG. 1B;

FIG. 1E is an elevational side view of the module as seen along the line 1E—1E shown in FIG. 1D and looking in the direction of the arrows;

FIG. 2 is a fragmentary isometric view of an electrical jack plug of the prior art suitable for use with the module shown in FIGS. 1A-1E;

FIG. 7A is an elevational side view of the intermediate electrical jack housing shown in FIG. 1B but with the wire members removed;

FIG. 7B is a plan view of the interlocking distal surface of the housing shown in FIG. 7A;

FIG. 7C is an elevational view of the opposing longitudinal side surface of the housing shown in FIG. 7A;

FIGS. 8A, 8B and 8C are views similar to those of FIGS. 7A, 7B and 7C, respectively, but with the wire members of the intermediate electrical jack installed;

FIG. 8D is a plan view of the proximal interlocking surface of the intermediate electrical jack taken along the line 8D—8D shown in FIG. 8A and looking in the direction of the arrows;

FIGS. 9A and 9B are cross-sectional views taken along the respective lines 9A—9A and 9B—9B shown in FIG. 8B and looking in the direction of the arrows;

FIGS. 10A and 10B are views similar to those shown in FIGS. 9A and 9B, respectively, but with an electrical jack plug inserted into the housing;

FIG. 11A is an elevational side view of the electrical jack housing having the distal surface of the module shown in Fig. 1D but with the wire members removed;

FIG. 11B is a plan view of the distal surface of the housing shown in FIG. 11A;

FIG. 11C is an elevational view of the opposing longitudinal side surface of the housing shown in FIG. 11A;

FIGS. 12A, 12B and 12C are similar to those of FIGS. 11A, 11B and 11C, respectively, but with the wire members of the electrical jack installed;

FIG. 12D is a plan view of the proximal interlocking surface of the electrical jack taken along the line 12D—12D shown in FIG. 12A and looking in the direction of the arrows;

FIGS. 13A and 13B are cross-sectional views taken along respective lines 13A—13A and 13B—13B shown in FIG. 12B and looking in the direction of the arrows;

FIGS. 14A and 14B are views similar to those shown in FIGS. 13A and 13B, respectively, but with an electrical jack plug inserted into the housing;

FIG. 15 is an isometric view of a jackfield assembly embodying the jackfield features of this invention as seen from the front and with the assembly in a preferred orientation;

FIG. 16 is an isometric view of the jackfield assembly shown in FIG. 15 but as seen from the rear and with the assembly inverted;

FIG. 19 is a fragmentary isometric view of a subassembly formed by securing the module interlocking strip to a module and soldering the terminals of the module to conductors of the printed circuit board;

FIG. 20 is a schematic view of the electrical connections formed by soldering the terminals of the module to conductors of the printed circuit board as shown in FIG. 19;

FIG. 21 is a fragmentary cross-sectional view taken along the line 21—21 shown in FIG. 15 and looking in the direction of the arrows.

DESCRIPTION OF THE PREFERRED EMBODIMENTS

Figure 3A:
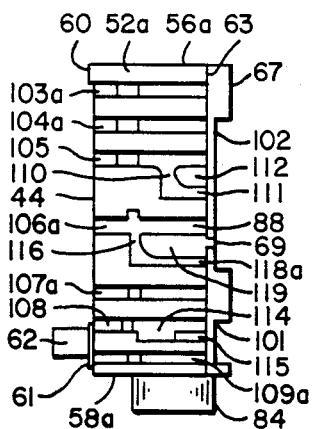
FIG. 3A is an elevational side view of the electrical jack housing having the terminal surface of the module shown in FIG. 1B but with the wire members removed.

Referring to the drawings wherein like characters of reference designate like parts throughout the several views, there is shown in FIGS. 1A-1E an electrical jack module 30 of the type disclosed in U.S. patent application Ser. No. 584,261 filed on Feb. 27, 1984 and assigned to the present assignee. Module 30 comprises a tri-stacked series of respective electrical jacks 32, 34 and 36 having elongated block-like housings 38, 40 and 42, respectively, made of dielectric material, such as moldable plastic material, for example. The housings 38, 40 and 42, are oriented similarly and disposed with their corresponding surfaces in substantially aligned relationship to interfit with one another and provide the module 30 with a resulting slab-like body having a generally uni-structural appearance.

Module 30 has a common terminal surface 44 from which an array of mutually spaced, resilient wire terminals 45, 46, 47, 48, 49 and 50, respectively, extend in a predetermined pattern. The respective wire terminals 45, 46 and 47 form a first linear group extending from a marginal portion of surface 44 adjacent a longitudinal side surface 52 of the module 30 and to one side of the transverse centerline of terminal surface 44. The respective wire terminals 48, 49 and 50 form a second linear group extending from an opposing marginal portion of surface 44 adjacent a longitudinal side surface 54 of the module 30 and to the other side of the transverse centerline of terminal surface 44. Thus, the first and second linear groups of wire terminals 45–47 and 48–50, respectively, are spaced apart axially and transversely of the terminal surface 44.

Between the first linear group of respective wire terminals 45–47 and an adjacent end surface 56 of module 30, there protrudes integrally from an end portion of terminal surface 44 a bar-like spacing boss 60 having a side surface substantially aligned with the end surface 56. The bar-like boss 60 extends transversely of terminal surface 44 from the longitudinal side surface 52 to the opposing longitudinal side surface 54 of module 30. Also, between the second linear group of respective wire terminals 48–50 and an adjacent end surface 58 of module 30, there protrudes integrally from an end portion of terminal surface 44 a disc-like spacing boss 61 which is centrally disposed relative to the respective side surfaces 52 and 54 of module 30. The disc-like spacing boss 61 protrudes from the terminal surface 44 a distance substantially equal to the distance which bar-like spacing boss 60 protrudes from terminal surface 44. Extending centrally from the disc-like spacing boss 61 is an integral orientation post 62 which constitutes a first restraining means of the module 30 for absorbing laterally directed pressure forces that would otherwise damage the wire terminals 45–50, respectively. The orientation post 62 may have any suitable cross-sectional configuration desired, such as square or circular, for examples, and preferably does not extend a greater distance from the terminal surface 44 than the wire terminals 45–50, respectively.

Housing 38 has opposing the terminal surface 44 a distal surface 63 disposed for mating with a proximal surface 64 of intermediate housing 40; and the housing 40 has an opposing distal surface 65 disposed for mating with a proximal surface 66 of housing 42. Protruding integrally from a central axial portion of surface 63 is a mesa-like ridge 67 which fits snugly into a complementary shaped channel 68 in a central axial portion of the surface 64 to provide means for restricting relative lateral movement of the respective housings 38 and 40. Also, the surface 63 has protruding integrally from opposing longitudinal marginal portions thereof respective mesa-like keys 69 and 70 which extend transversely of surface 63 and fit snugly into respective conformingly shaped keyways 71 and 72 in the surface 64 to provide means for restricting relative longitudinal movement of housings 38 and 40, respectively. Similarly, the surface 65 has protruding integrally from a central axial portion thereof a mesa-like ridge 73 which fits snugly into a complimentary shaped channel 74 in an axial central portion of the surface 66 to provide means for restricting relative lateral movement of the respective housings 40 and 42. Moreover, the surface 65 has protruding integrally from opposing longitudinal marginal portions thereof respective mesa-like keys 75 and 76 which extend transversely of surface 65 and fit snugly into respective conformingly shaped keyways 77 and 78 to provide means for restricting relative longitudinal movement of the housings 40 and 42, respectively.

In accordance with this invention, the module 30 has opposing the terminal surface 44 an attitude control surface 80 which has protruding integrally therefrom a plurality of movement-restricting stubs, 82 and 83, respectively, comprising a second restraining means of module 30. The stubs 82 and 83 may be provided with respective cross-sectional configurations, such as square or circular, for examples, and may be spaced from one another as well as from respective edges of the attitude control surface 80 as desired. Moreover, the end surface 58 of module 30 has protruding integrally therefrom a plurality of plug-receiving collars, 84, 85 and 86, respectively, which are spaced from one another and from respective edges of the end surface 58 suitably for constituting a third restraining means of module 30.

The collars 84, 85 and 86 encircle open ends of respective bores 88, 89 and 90 which extend longitudinally into the housings 38, 40 and 42, respectively. In this instance, the collars 84, 85 and 86 as well as the bores 88, 89 and 90, respectively, are disposed closer to the respective distal surfaces 63, 65 and 80 than to the respective proximal surfaces 44, 64 and 66 of housings 38, 40 and 42, respectively. Also, the housing 42 is slightly different from the housings 38 and 40 in that the distal surface 80 is spaced a greater distance from proximal surface 66 than the distal surfaces 63 and 65 are spaced from the proximal surfaces 44 and 64, respectively. Consequently, the collar 86 is spaced a greater distance from the intermediate collar 85 than the collar 85 is spaced from the collar 84. The opposing end surface 56 of module 30 may include opposing open ends of the respective bores 88–90 or may comprise closed ends of the bores 88–90, respectively, as desired.

In FIG. 2, there is shown a conventional type of electrical jack plug 92 which is suitable for use with module 30 and comprises a cylindrical body 93 extending axially from a dielectric sleeve 94 of relatively larger diameter. Adjacent the dielectric sleeve 94, the body 93 comprises an electrically conductive sleeve 96 which is insulatingly connected through a dielectric annulus 97 to an electrically conductive ring 98. The ring 98 is insulatingly connected through a second dielectric annulus 99 to an electrically conductive tip 100 comprising the distal end portion of cylindrical body 93. The tip 100 and ring 98 are connected electrically through the sleeve 96 in a well-known, mutually insulated manner to respective terminals (not shown) in the dielectric sleeve 94 for connection to respective electrical conductors in a cable (not shown) which may have an electrically grounded conductor connected to the sleeve 96. Thus, the cylindrical probe-like body 93 of jack plug 92 may be inserted axially through a respective collar 84–86 and into the aligned bore 88–90, respectively, for the purpose of making electrical connections to respective electrically conductive portions of the body 93 within the associated housings 38–42, respectively.

Figure 3B:
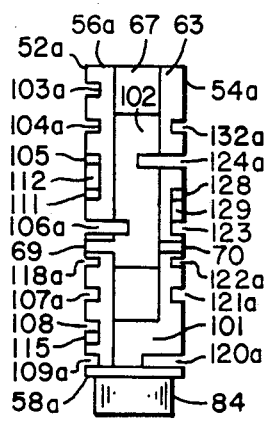
FIG. 3B is a plan view of the distal surface opposite the terminal surface of the housing shown in FIG. 3A.
Figure 3C:
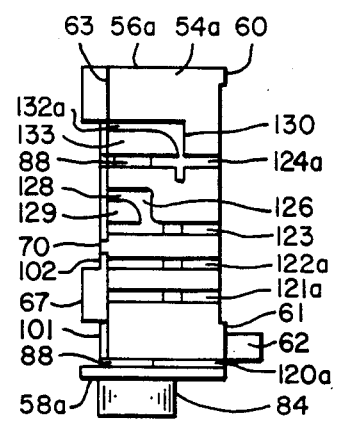
FIG. 3C is an elevational view of the opposing longitudinal side surface of the housing shown in FIG. 3A.

As shown in FIGS. 3A–3C, the terminal surface 44 comprises a base surface of the housing 38 having opposing end portions from which extend integrally the respective bosses 60 and 61, the boss 61 having protruding integrally therefrom orientation post 62. Also, the housing 38 has opposing end surfaces 56A and 58A, respectively, which comprise aligned component parts of the module end surfaces 56 and 58, respectively. The housing 38 has opposing the terminal surface 44 the distal surface 63 which has protruding integrally therefrom the mesa-like ridge 67 and the keys 69 and 70, respectively. Ridge 67 has disposed therein two recessed landings, 101 and 102, respectively, which extend entirely across the ridge 67. Moreover, the housing 38 has opposing longitudinal side surfaces 52A and 54A, respectively, which comprise aligned component parts of the module side surfaces 52 and 54, respectively.

Disposed in the longitudinal side surface 52A of housing 38 is a plurality of mutually spaced grooves 103A, 104A, 105, 106A, 107A, 108 and 109A, respectively, which extend in substantially parallel relationship with one another from the terminal surface 44 to the distal surface 63 of housing 38. The grooves 103A, 104A, 105, 107A, 108 and 109A are stepped to be relatively shallow adjacent the distal surface 63 so that they do not penetrate into the bore 88 in housing 38. Groove 105 has an end portion adjacent surface 63 communicating through a laterally extending groove 110 with an end portion of a groove 111 which extends in substantially parallel relationship with the groove 105 to the distal surface 63 of housing 38. The respective grooves 110 and 111 are disposed in the surface 52A to a depth approximately equal to the depth of the relatively shallow end portion of groove 105 adjacent distal surface 63 so that they also do not penetrate into the bore 88 in housing 38. The communicating grooves 105, 110, and 111 respectively, define a ramp-like surface portion 112 which slopes outwardly from a portion of distal surface 63 adjacent the ridge 67 such that it is substantially flush with surface 52A adjacent the groove 110. Also, the groove 108 has a laterally extended portion 114 aligned with a ramp-like surface portion 115 which slopes outwardly from a portion of distal surface 63 adjacent the ridge 67 such that it is substantially flush with surface 52A adjacent the laterally extended portion 114 of groove 108.

The groove 106A is disposed sufficiently deep in surface 52A that its end portion adjacent the distal surface 63 communicates with the bore 88 in housing 38. Groove 106A has an opposing end portion adjacent terminal surface 44 communicating with a transverse groove 116 which is disposed in surface 54A at approximately the same depth as groove 106A but, due to its proximity to terminal surface 44, does not penetrate into bore 88. The laterally extending groove 116 communicates with a relatively shallow groove 118A which extends in substantially parallel relationship with groove 106A to the distal surface 63. Groove 118A is disposed in the surface 52A at about the depth of groove 111, for example, so that it does not penetrate into bore 88. Thus, only the groove 106A is disposed sufficiently deep in surface 54A to communicate with the bore 88 in housing 38. The communicating grooves 106A, 116 and 118A, respectively, define a plateau-like surface portion 119 which is substantially flush with surface 52A and has generally abrupt or sheer sides adjacent the grooves 106A, 116 and 118A, respectively.

The opposing longitudinal side surface 54A of housing 38 has disposed therein a plurality of grooves 120A, 121A, 122A, 123 and 124A, respectively, which extend in substantially parallel relationship with one another from the terminal surface 44 to the distal surface 63 of housing 38. The grooves 121A, 122A and 123 are stepped to have relatively shallow end portions adjacent distal surface 63 and do not penetrate into bore 88. Groove 123 has an end portion adjacent surface 63 communicating through a laterally extending groove 126 with a groove 128 extending in substantially parallel relationship with the groove 123 to the surface 63. The respective grooves 126 and 128 are disposed in surface 54A to a depth approximately equal to the depth of the relatively shallow end portion of groove 123 adjacent surface 63 so that they also do not penetrate into bore 88. The communicating grooves 123, 126 and 128, respectively, define a ramp-like surface portion 129 which slopes outwardly from a portion of distal surface 63 adjacent ridge 67 such that it is substantially flush with surface 54A adjacent the groove 126.

Grooves 120A and 124A, respectively, are disposed sufficiently deep in surface 54A that their respective end portions adjacent surface 63 communicate with the bore 88 in housing 38. The groove 124A has an end portion adjacent terminal surface 44 communicating with a laterally extending groove 130 which is disposed in surface 54A at approximately the same depth as groove 124A but, due to its proximity to terminal surface 44, does not penetrate into the bore 88. Laterally extending groove 130 communicates with a relatively shallow groove 132A which extends in substantially parallel relationship with groove 124A to the distal surface 63 of housing 38. The groove 132A is disposed in the surface 54A at about the depth of groove 128, for example, so that it does not penetrate into bore 88. Communicating grooves 124A, 130 and 132, respectively, define a plateau-like surface portion 133 which is substantially flush with surface 54A and has generally abrupt or sheer sides adjacent the grooves 124A, 130 and 132A, respectively.

Figure 4A:
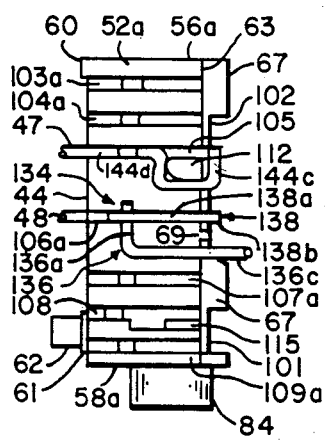
FIGS. 4A, 4B and 4C are views similar to those of FIGS. 3A, 3B and 3C, respectively, but with the wire members of the electrical jack installed.
Figure 4B:
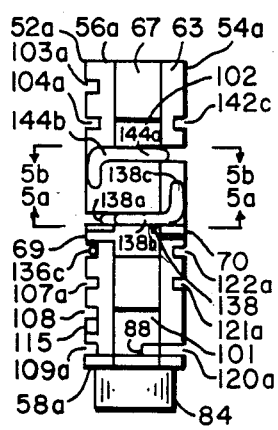
Figure 4C:
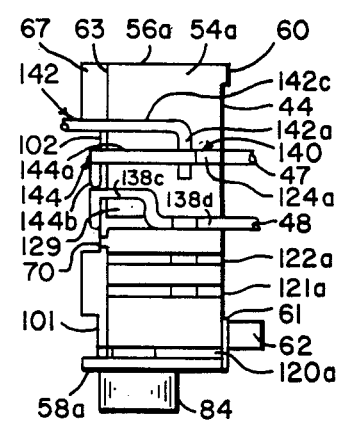

As shown in FIGS. 4A–4C, there is embedded in surface 52A an electrical switch 134 having an outer moveable contact member 138A disposed substantially orthogonal to an inner stationary contact member 136A. The stationary contact member 136A is press-fitted into relatively deep groove 116 shown in FIG. 3A and comprises an orthogonally bent end portion of a pre-shaped shunt wire 136 made of resilient material, such as beryllium copper, for example. Shunt wire 136 includes an intermediate portion 136C integrally joined to the orthogonally bent end portion 136A and press-fitted into relatively shallow groove 118A (FIG. 3A) from which it extends beyond distal surface 63 of housing 38. Thus, the shunt wire 136 is embedded in surface 52A with sufficient snugness to provide the necessary frictional engagement with wall surfaces of the respective grooves 116 and 118A for holding the shunt wire 136 firmly in place even during operation of the switch 134.

Figures 5A, 5B:
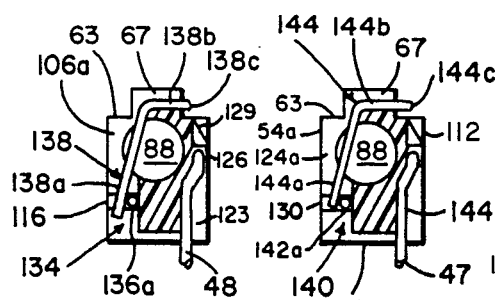
FIGS. 5A and 5B are cross-sectional views taken along respective lines 5A—5A and 5B—5B shown in FIG. 4B and looking in the direction of the arrows.

As shown in FIG. 5A, the moveable contact member 138A is disposed in the relatively deep groove 106A across which the end portion 136A of shunt wire 136 extends. The moveable contact member 138A comprises an integral end portion of a pre-shaped spring wire 138 made of resilient material, such as beryllium copper, for example. By virtue of the resilient material of wire 138, the moveable contact member 138A is biased into electrical engagement with the stationary contact member 136A when the switch 134 is in a normally closed condition. Moveable contact member 138A extends chordally through the bore 88 in housing 38 and at the distal surface 63 of housing 38 is integrally joined to a bight portion 138B of spring wire 138 extending across the recessed landing 102 in ridge 67.

Adjacent the surface 54A, the bight portion 138B is provided with a coplanar right-angle bend for extending along a marginal portion of surface 63 aligned with the ramp-like portion 129 (FIG. 3C) of surface 54A. The bight portion 138B is integrally joined to an orthogonal elbow portion 138C of spring wire 138 press-fitted into the groove 128 (FIG. 3C) and curved for press-fitting into the groove 126 shown in FIG. 3C. Elbow portion 138C is integrally joined to a leg portion 138D of spring wire 138 which is press-fitted into the stepped end portion of groove 123 (FIG. 3C) adjacent terminal surface 44. Leg portion 138D extends to the terminal surface 44 where it is integrally joined to the protruding wire terminal 48.

Thus, the spring wire 138 is embedded in the surface 54A with sufficient snuggness to provide the necessary frictional engagement with wall surfaces of the respective grooves 123, 126 and 128 for holding the spring wire 138 firmly in place even during operation of the switch 134. Accordingly, when an axial insertion force is applied to the wire terminal 48, it is absorbed by the elbow portion 138C bearing against side wall surfaces of groove 116. Also, when an axial withdrawal force is applied to the wire terminal 48 it is absorbed by the elbow portion 138C bearing against the opposing side wall surfaces of groove 116. Furthermore, the wire terminal 48 is electrically connected through the described integral portions of spring wire 138 to the moveable contact member 138A of switch 134.

Moreover, there is disposed in the surface 54A an electrical switch 140 having an outer moveable contact member 144A disposed substantially orthogonal to an inner stationary contact member 142A. The stationary contact member 142A is press-fitted into relatively deep groove 130 shown in FIG. 3C and comprises an orthogonally bent end portion of a pre-shaped shunt wire 142 made of resilient material, such as beryllium copper, for example. Shunt wire 142 includes an intermediate portion 142C integrally joined to the orthogonally bent end portion 142A and press-fitted into groove 132A (FIG. 3C) from which it extends beyond mating surface 63 of housing 38. Thus, the shunt wire 142 is embedded in surface 54A with sufficient snuggness to provide the necessary frictional engagement with wall surfaces of the respective grooves 130 and 132A for holding the shunt wire 142 firmly in place even during operation of the switch 140.

As shown in FIG. 5B, the moveable contact member 144A is disposed in the relatively deep groove 124A across which the end portion 142A of shunt wire 142 extends. The moveable contact member 144A comprises an integral end portion of a pre-shaped spring wire 144 made of resilient material, such as beryllium copper, for example. By virtue of the resilient material of wire 144, the moveable contact member 144A is biased into electrical engagement with the stationary contact member 142A when the switch 140 is in a normally closed condition. Moveable contact member 144A extends chordally through the bore 88 in housing 38 and at surface 63 of housing 38 is integrally joined to a bight portion 144B of spring wire 144 extending across the recessed landing 102 in ridge 67.

Adjacent the surface 52A, the bight portion 144B is provided with a coplanar right-angle bend for extending along a marginal portion of surface 63 aligned with the ramp-like portion 112 of surface 52A. The bight portion 144B is integrally joined to an orthogonal elbow portion 144C press-fitted into the groove 111 (FIG. 3A) and curved to extend through the communicating groove to the groove 105. Elbow portion 144C is integrally joined to a leg portion 144D of spring wire 144 which is press-fitted into the stepped end portion of groove 105 adjacent terminal surface 44. Leg portion 144D extends to the terminal surface 44 where it is integrally joined to the protruding wire terminal 47. Thus, the spring wire 144 is embedded in the surface 52A with sufficient snuggness to provide the necessary frictional engagement with wall surfaces of respective grooves 105, 110 and 111 for holding the spring wire 144 firmly in place even during operation of the switch 140. Also, the wire terminal 47 is electrically connected through the described integral portions of spring wire 144 to the moveable contact member 144A of switch 140.

Figures 6A, 6B:
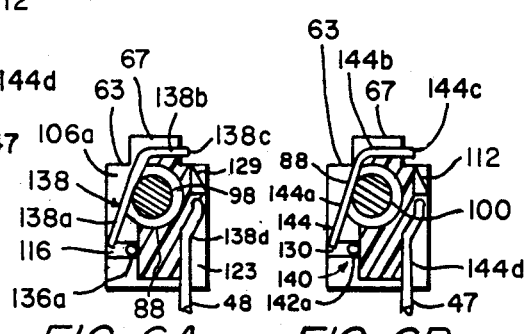
FIGS. 6A and 6B are views similar to those of FIGS. 5A and 5B, respectively, but with an electrial jack plug inserted into the housing.

The respective electrical switches 134 and 140 are operable by means of the electrical jack plug 92 shown in FIG. 2 having its cylindrical body 93 slidingly inserted through the integral collar 84 of housing 38 and fully into bore 88. As shown in FIGS. 6A and 6B, the electrically conductive tip portion 100 of plug 92 is brought into interference engagement with the moveable contact member 144A of switch 140; and the electrically conductive ring portion 98 is brought into interference engagement with the moveable contact member 138A of switch 134. As a result of this sliding interference engagement, the respective moveable contact members 144A and 138A are flexed resiliently away from the stationary contact members 142A and 136A, respectively, and toward the respective surfaces 54A and 52A, respectively, without protruding therefrom. Consequently, the respective switches 140 and 134 are opened and the tip portion 100 of plug 92 is electrically connected through the spring wire member 144 to the wire terminal 47 while the ring portion 98 of plug 92 is electrically connected through the spring wire 138 to the wire terminal 48. Accordingly, the shunt wire 142 including the stationary contact member 142A of switch 140 may be referred to as the "tip" shunt wire; and the shunt wire 136 including the stationary contact member 136A of switch 134 may be referred to as the "ring" shunt wire.

FIGS. 6A and 6B also indicate a method for preventing interference of the inner stationary contact members 136A and 142A with the resiliently biased moveable contact members 138A and 144A, respectively, during installation of the pre-shaped wires 138 and 144 on the housing 38. The method comprises slidably inserting the cylindrical body 93 of jack plug 92 into the bore 88 prior to installation of the respective spring wires 138 and 144. Then, the spring wire 138, for example, may be held above the mating surface 63 of housing 38 so that the leg end portion 138D of wire 138 is insertable in the end portion of groove 123 adjacent surface 63 and the moveable contact member 138A is aligned for insertion into the groove 106A. The bight portion 138B of pre-shaped wire 138 is pressed toward the surface 63 thereby causing the leg portion 138D to travel through the groove 123 toward the terminal surface 44, the elbow portion 138C to ride up the ramp-like portion 129 of surface 54A, and the moveable contact member 138A to enter the groove 106a. As a result, the moveable contact member 138A is brought into interference engagement with the ring portion 98 of jack plug 92 and is flexed outwardly to avoid butting engagement with the stationary contact member 136A previously press-fitted into the transverse groove 116, as described.

When the bight portion 138B of spring wire 138 is seated on the recessed landing 102, the leg portion 138D is fully positioned in the end portion of groove 123 so that the wire terminal 48 protrudes the desired length therefrom. Also, the elbow portion 138C has snapped into the respective grooves 126 and 128 with sufficient force to be embedded in the surface 54A. Furthermore, the moveable contact member 138A is fully positioned in the groove 106A for biased electrical engagement with the stationary contact member 136A. The preshaped spring wire 144 is installed in a similar manner whereby the tip portion 100 of jack plug 92 aids in avoiding interference of the stationary contact member 142A with the resiliently biased moveable contact member 144A. Subsequently, when the cylindrical body 93 of jack plug 92 is slidingly withdrawn from the bore 88, the respective moveable contact members 138A and 144A spring back into electrical engagement with the respective stationary contact members 136A and 142A to dispose the respective electrical switches 134 and 140 in a normally closed condition.

As shown in FIGS. 7A–7C, the intermediate housing 40 has opposing side surfaces, 52B and 54B, respectively, which comprise aligned component parts of the module side surfaces 52 and 54, respectively, shown in FIGS. 1A–1E. Housing 40 also has opposing end surfaces, 56B and 58B, respectively, which comprise aligned component parts of the module end surfaces 56 and 58, respectively, shown in FIGS. 1B–1E. The end surface 58B has protruding integrally therefrom the collar 85 which, as shown in FIG. 1A, encircles the entrance end of bore 89 disposed longitudinally in housing 40 adjacent its distal mating surface 65. Distal surface 65 has protruding integrally from a central axial portion thereof the ridge 73 shown in FIG. 1A, and has protruding integrally from opposing marginal portions adjacent the respective side surfaces 52A and 54A the keys 75 and 76 shown in FIGS. 1B and 1E, respectively. The ridge 73, as shown most clearly in FIG. 7B, has disposed therein two recessed landings, 145 and 146, respectively, each of which extends entirely across the ridge 73.

The housing 40 has opposing the distal surface 65 the proximal surface 64 which, as shown in FIG. 1A, mates with the distal surface 63 of housing 38. The proximal mating surface 64 of housing 40 has disposed in its axial central portion, as shown in FIG. 1A, the channel 68 which interlockingly receives ridge 67 protruding integrally from the distal mating surface 63 of housing 38 to prevent relative lateral movement of the respective housings 38 and 40. Also, the proximal mating surface 64 has disposed in opposing marginal portions thereof adjacent the respective side surfaces 52B and 54B the keyways 71 and 72, respectively. The keyways 71 and 72, as shown in FIGS. 1B and 1E, respectively, are suitably located for interlockingly receiving the respective keys 69 and 70 to prevent relative longitudinal movement of the housings 38 and 40. Moreover, the proximal mating surface 64 of housing 40 has disposed in its marginal portion adjacent side surface 54B a notch 148 and in its marginal portion adjacent side surface 52B axially spaced notches, 149 and 150, respectively. As shown more clearly in FIG. 8D, the notch 148, and the keyway 72 extend from the side surface 54B of housing 40 into communication with the central channel 68 axially disposed in surface 64. Also, the respective notches 149 and 150 as well as the keyway 71 extend from the side surface 52B of housing 40 into communication with the central channel 68.

In the further fabrication of module 30, the assembled electrical jack 32 has mated to the distal surface 63 of housing 38 the proximal surface 64 of housing 40 prior to the assembly of electrical jack 34. Accordingly, as shown in FIG. 1E, when the proximal surface 64 of housing 40 is mated with the distal surface 63 of housing 38, the notch 148 in surface 64 is aligned with the previously assembled spring wire 138 to avoid interference with the bight portion thereof extended over the surface 63, as described. Also, as shown in FIG. 1B, when the proximal surface 64 of housing 40 is mated with the distal surface 63 of housing 38, the notch 149 is aligned with the respective grooves 108 and 109A shown in FIG. 4A. Moreover, the notch 150 is aligned with the previously assembled spring wire 144 to avoid interference with the bight portion thereof extended over the surface 63, as described.

Referring again to FIGS. 7A–7C, there is disposed in the longitudinal side surface 52B a plurality of mutually spaced and substantially parallel grooves, 103B, 104B, 106B, 107B and 109B, respectively, which extend from the proximal mating surface 64 to the distal mating surface 65 of housing 40. The grooves 103B, 104B, 107B and 109B have respective depths conforming to the depths of adjacent and relatively shallow end portions of the respective grooves 103A, 104A, 107A and 109A shown in FIG. 3A; and the groove 106B has a depth conforming to the depth of relatively deep groove 106A shown in FIG. 3A. Consequently, the end portions of respective grooves 103B, 104B, 107B and 109B adjacent distal mating surface 65 are sufficiently shallow that they do not penetrate into the bore 89 in housing 40. On the other hand, the groove 106B is sufficiently deep that the end portion thereof adjacent distal mating surface 65 penetrates into and communicates with the bore 89 in housing 40.

Groove 106B has an end portion adjacent proximal mating surface 64 communicating with a transverse groove 152 which has a depth conforming to the depth of relatively deep groove 106B and is similar to the groove 116 shown in FIG. 3. The groove 152, in turn, communicates with a generally orthogonal groove 118B extending to the proximal mating surface 64 in substantially parallel relationship with the adjacent end portion of groove 106B. However, unlike the communicating grooves 152 and 106B, the groove 118B is relatively shallow and has a depth conforming to the depth of groove 118A shown in FIG. 3. The groove 118B in conjunction with the substantially parallel end portion of groove 106B and the interconnecting portion groove 152 defines a plateau-like portion 154 of surface 52B which is substantially flush with the surface 52B and has substantially sheer or abrupt side wall surfaces adjacent the plateau-defining portions of grooves 106B, 152 and 118B, respectively.

The groove 103B has an end portion adjacent distal mating surface 65 communicating through a laterally extending groove 155 with the adjacent end portion of groove 104B. Consequently, the communicating end portions of respective grooves 103B and 104B adjacent distal surface 65 in conjunction with interconnecting groove 155 define a ramp-like portion 156 of surface 52B. The ramp-like surface portion 156 slopes outwardly from a portion of surface 65 adjacent ridge 78 such that it is substantially flush with surface 52B adjacent the groove 155. The groove 104B has a mid-portion communicating through a laterally extending groove 157 with a groove 158B extending to the distal mating surface 65 in substantially parallel relationship with the adjacent end portion of groove 104B. As a result, the end portion of groove 104B adjacent surface 65 and the communicating grooves 157 and 158B, respectively, define a plateau-like portion 160 of surface 52B which is substantially flush with surface 52B and has substantially sheer or abrupt side wall surfaces adjacent the defining end portion of groove 104B and the communicating grooves 162 and 164, respectively.

The groove 107B has a mid-portion communicating through a laterally extending groove 161 with a groove 162B extending to the distal surface 65 in substantially parallel relationship with the adjacent end portion of groove 107B. Consequently, the end portion of groove 107B in conjunction with the communicating grooves 161 and 162, respectively, defines a ramp-like portion 164 of surface 52B which slopes outwardly from a portion of distal surface 65 adjacent ridge 73 such that it is substantially flush with surface 52B adjacent the groove 161. The groove 109B has a laterally extended portion 163 aligned with a ramp-like portion 165 of surface 52B which slopes outwardly from a portion of distal surface 65 adjacent ridge 63 such that it is substantially flush with surface 52B adjacent the laterally extended portion 163 of groove 109B.

Disposed in the longitudinal side surface 54B of housing 40 is a plurality of grooves 120B, 121B, 122B, and 124B, respectively, which extend from the proximal mating surface 64 to the distal mating surface 65 of housing 40. The grooves 121B and 122B have respective depths conforming to the depths of adjacent end portions of the respective grooves 121A and 122A shown in FIG. 3C; and the grooves 120B and 124B have respective depths conforming to the depths of respective grooves 120A and 124A shown in FIG. 3C. Consequently, the end portions of respective grooves 121B and 122B adjacent the distal mating surface 65 are sufficiently shallow that they do not penetrate into the bore 89 in housing 40 shown in FIG. 1A. On the other hand, the respective grooves 120B and 124B are sufficiently deep that they penetrate into and communicate with the bore 89 in housing 40.

Groove 124B has an end portion adjacent proximal mating surface 64 communicating with a transverse groove 166 which has a depth conforming to the depth of relatively deep groove 124B and is similar to the groove 130 shown in FIG. 3C. The groove 166, in turn, communicates with a generally orthogonal groove 132B extending to the proximal mating surface 64 in substantially parallel relationship with the adjacent end portion of groove 124B. However, unlike the communicating grooves 166 and 124B, groove 132B is relatively shallow and has a depth conforming to the depth of groove 132A shown in FIG. 3C. The groove 132A in conjunction with the substantially parallel adjacent end portion of groove 124B and the interconnecting portion of groove 166 defines a plateau-like portion 168 of surface 54B which is substantially flush with the surface 54B and has substantially sheer or abrupt side wall surfaces adjacent the plateau-defining portions of grooves 124B, 166 and 132B, respectively.

The groove 121B has an end portion adjacent distal mating surface 65 communicating through a laterally extending groove 169 of relatively similar depth with the adjacent end portion groove 122B. Consequently, the communicating end portion of respective grooves 121B and 122B adjacent distal surface 65 in conjunction with interconnecting groove 169 define a ramp-like portion 170 of surface 54B. The ramp-like surface portion 170 slopes outwardly from a portion of distal surface 65 adjacent ridge 73 such that it is substantially flush with surface 54B adjacent groove 169. The groove 122B has a mid-portion communicating through a laterally extending groove 171 with a groove 172B extending to distal surface 65 in substantially parallel relationship with the adjacent end portion of groove 122B. As a result, the end portions of substantially parallel grooves 122B and 172B, respectively, adjacent distal surface 65 and the interconnecting groove 171 define a plateau-like portion 174 of surface 54B which is substantially flush with surface 54B and has substantially sheer or abrupt side wall surfaces adjacent the plateau-defining portions of grooves 122B, 171 and 172B, respectively.

As shown in FIGS. 8A–8D, there is disposed in side surface 52B of housing 40 an electrical switch 176 having an outer moveable contact member 178A disposed substantially orthogonal to an inner stationary contact member 136B. The stationary contact member 136B comprises an orthogonally bent end portion of resilient shunt wire 136 having an integral mid-portion 136C extending, as shown in FIG. 4A, from the relatively shallow groove 118A and beyond the distal surface 63 of housing 38. Also, there is disposed in side surface 54B of housing 40 an electrical switch 180 having an outer moveable contact member 182A disposed substantially orthogonal to an inner stationary contact member 142B. The stationary contact member 142B comprises an orthogonally bent end portion of resilient shunt wire 142 having an integral mid-portion 142C extending, as shown in FIG. 4C, from the relatively shallow groove 132A and beyond the distal surface 63 of housing 38.

From a comparison of FIG. 1B with FIGS. 3A and 7A, it may be seen that when the proximal surface 64 of housing 40 is mated to the distal surface of housing 38, the respective grooves 103B, 104B, 106B, 118B, 107B and 109B and 118B in the side surface 52B shown in FIG. 7A are substantially aligned with and form extensions of respective grooves 103A, 104A, 106A, 118A, 107A and 109A in the side surface 52A shown in FIG. 3A. Also, from comparison of FIG. 1E with FIGS. 3C and 7C, the respective grooves 120B, 121B, 122B, 124B and 132B in the side surface 54B shown in FIG. 7C are substantially aligned with and form extensions of respective grooves 120A, 121A, 122A, 124A and 132A in the side surface 54A shown in FIG. 3C. Accordingly, after the electrical jack 32 is assembled and prior to mating proximal surface 64 of housing 40 to distal surface 63 of housing 38, the pre-shaped shunt wires 136 and 142 may be rotated about their respective end portions 136A and 142a in relatively deep grooves 116 and 130, respectively, so that they project outwardly from the side surfaces 52A and 54A. Then, after the proximal surface 64 of housing 40 is mated to the distal surface 63 of housing 38, the pre-shaped shunt wire 136 may be rotated in the reverse angular direction to press-fit the mid-portion 136C of wire 136 in the substantially aligned grooves 118A and 118B, respectively, and press-fit the orthogonally bent end portion 136B of wire 136 in the relatively deep groove 152 in side surface 52B of housing 40. Similarly, the pre-shaped shunt wire 142 may be rotated in the reverse angular direction to press-fit the mid-portion 142C of wire 142 in the substantially aligned grooves 132A and 132B, respectively, and press-fit the orthogonally bent end portion 142B of wire 142 into the relatively deep groove 166 in side surface 54B of housing 40.

As a result, the pre-shaped shunt wire 136 is embedded in side surface 52B with sufficient snugness to provide the necessary frictional engagement with wall surfaces of the respective grooves 152 and 118B for holding the shunt wire 136 firmly in place even during operation of the switch 176. Also, the pre-shaped shunt wire 142 is embedded in side surface 54B with sufficient snugness to provide the necessary frictional engagement with wall surfaces of the respective grooves 166 and 132B for holding the shunt wire 142 firmly in place even during operation of the switch 180. Moreover, the integral shunt wire 136 serves to connect the stationary contact members 136A and 136B of respective switches 134 and 176 electrically to one another on the module 30; and the shunt wire 142 serves to connect the stationary contact members 142A and 142B of respective switches electrically to one another on the module 30. Thus, in the design and fabrication of module 30, the integral shunt wires 136 and 142, respectively, eliminate the need for having additional wire terminals protruding from the terminal surface 44 of module 30 and eliminate the need for additional connective operations, such as welding and wire-wrapping, for examples.

As shown in FIG. 9A, the moveable contact member 178A of switch 176 is disposed in the relatively deep groove 106B across which the end portion 136B of ring shunt wire 136 extends. The moveable contact member 178A comprises an integral end portion of a pre-shaped spring wire 178 made of resilient material, such as beryllium copper, for example. By virtue of the resilient material of wire 178, the moveable contact member 178A is biased into electrical engagement with the stationary contact member 136B when the switch 176 is in a normally closed condition. Moveable contact member 178A extends chordally through the bore 89 to the distal surface 65 of housing 40 where it is integrally joined to a bight portion 178B of spring wire 178 extending across the recessed landing 146 in ridge 73 and has a coplanar right-angle bend for extending along a marginal portion of surface 65 adjacent side surface 54B. The bight portion 178B is integrally joined to an orthogonal elbow portion 178C of spring wire 178 extended along the groove 122B and curved to extend through the communicating groove 169 (FIG. 7C) to extend to the groove 121B in side surface 54B. Elbow portion 178C is integrally joined to a leg portion 178D of spring wire 178 extending through the groove 121B and beyond the proximal mating surface 64 of housing 40.

As shown in FIG. 9B, the moveable contact member 182A of switch 180 is disposed in the relatively deep groove 124B across which the end portion of tip shunt wire 142 extends. The moveable contact member 182A comprises an integral end portion of a pre-shaped spring wire 182 made of resilient material, such as beryllium copper, for example. By virtue of the resilient material of wire 182, the moveable contact member 182A is biased into electrical engagement with the stationary contact member 142B when the switch 180 is in a normally closed condition. Moveable contact member 182A extends chordally through the bore 89 to the distal surface 65 of housing 40 where it is integrally joined to a bight portion 182B of spring wire 182 extending across the recessed landing 146 in ridge 73 and has a coplanar right-angle bend for extending along a marginal portion of surface 65 adjacent side surface 52B. The bight portion 182B is integrally joined to an orthogonal elbow portion 182C extended along the groove 104B and curved to extend through the communicating groove 155 to the groove 103B. Elbow portion 182C is integrally joined to a leg portion 182D of spring wire 182 extended through the groove 103B and beyond the proximal mating surface 64 of housing 40.

The respective electrical switches 176 and 180 are operable by means of the electrical jack plug 92 shown in FIG. 2 having its cylindrical body 93 slidingly inserted through the integral collar 85 of housing 40 and fully into the bore 89. As shown in FIGS. 10A and 10B, the electrically conductive tip portion 100 of plug 92 is brought into interference engagement with the moveable contact member 182A of switch 180; and the electrically conductive ring portion 98 of plug 92 is brought into interference engagement with the moveable contact member 178a of switch 176. As a result of this sliding engagement, the respective moveable contact members 182A and 178A are flexed resiliently away from the stationary contact members 142B and 136B, respectively, and toward the surfaces 54B and 52B, respectively, without protruding therefrom. Consequently, the respective switches 180 and 176 are opened with the tip portion 100 of plug 92 being electrically connected to the moveable contact member 182A of switch 180 while the ring portion 98 of plug 92 is electrically connected to the moveable contact member 178 of switch 176.

Also, the cylindrical body 93 of plug 92 slidably inserted into the bore 89 of housing 40 provides means for preventing interference of the stationary contact members 136B and 142B with the moveable contact members 178A and 182A, respectively, during installation of the spring wires 178 and 182 on the housing 40. Accordingly, after the proximal surface 64 of housing 40 is mated to the distal surface 63 of housing 38 and the respective shunt wires 136 and 142 are installed as described, the cylindrical body 93 of plug 92 may be slidably inserted into the bore 89. Then, the spring wire 178, for example, may be held above the distal surface 65 of housing 40 so that the leg portion 178D of wire 178 is insertable in the end portion of groove 121B adjacent surface 65 and the moveable contact member 178A is aligned for insertion into the groove 106B. The bight portion 178B of pre-shaped spring wire 178 is pressed toward the surface 65 thereby causing the leg portion 178D to travel through the groove 121B, the elbow portion 178C to ride up the ramp-like portion 170 of surface 54B, and the moveable contact member to enter the groove 106B. As a result, the moveable contact member 178A is brought into interference engagement with the ring portion 98 of plug 92 and is flexed resiliently outward to avoid butting engagement with the stationary contact member 136B previously press-fitted into the tranverse groove 152, as described.

When the bight portion 178B of spring wire 178 is seated on the recessed landing 146 in ridge 73 of housing 40, the moveable contact member 178A of wire 178 is positioned in groove 106B for biased electrical engagement with the stationary contact member 136B of switch 176. Moreover, the elbow portion 178C of wire 178, after snapping from the ramp-like portion 170 of surface 54B, is embedded therein by press-fitting into the communicating grooves 122B and 169 (FIG. 7C), respectively. Also, as may be seen by a comparison of FIG. 1E with respective FIGS. 4C and 8C, the leg portion 178D of wire 178 is disposed in the substantially aligned grooves 121B and 121A and in respective side surfaces 54B and 54A and is integrally joined to wire terminal 50 protruding a desired distance from the terminal surface 44 of module 30.

The spring wire 182 is installed in a similar manner to seat the bight portion 182B of wire 182 on the recessed landing 146 in ridge 73 of housing 40 and position the moveable contact member 182A in groove 124B for biased electrical engagement with the stationary contact member 142B of switch 180. As a result, the elbow portion 182B of wire 182, after snapping from the ramp-like portion 156 of surface 52B, is embedded therein by press-fitting into the communicating grooves 104B and 155 (FIG. 7A), respectively. Also, as may be seen by a comparison of FIG. 1B with respective FIGS. 4A and 8A, the leg portion 182D of wire 182 is disposed in the substantially aligned grooves 103B and 103A and is integrally joined to wire terminal 45 protruding a desired distance from the terminal surface 44 of module 30.

Thus, the wire terminal 45 is electrically connected through the other integral portions of pre-shaped spring wire 182 to the moveable contact member 182A of switch 180; and the wire terminal 50 is electrically connected through the other integral portions of pre-shaped spring wire 178 to the moveable contact member 178A of switch 176. After installation of the respective spring wires 182 and 178 is completed, the cylindrical body 93 of jack plug 92 may be slidably withdrawn from the bore 89 of housing 40. As a result, the respective moveable contact members 182A and 178A spring resiliently into electrical engagement with the respective stationary contact members 142B and 136B to place the respective electrical switches 180 and 176 in their normally closed conditions. Consequently, when the switch 180 is in the normally closed condition, the wire terminal 45 is electrically connected through the tip shunt wire 142, as shown in FIG. 1E, to the stationary contact member 142A of the switch 140 which has its moveable contact member 144A connected integrally to wire terminal 47. Also, when the switch 176 is in the normally closed condition, the wire terminal 50 is electrically connected through the ring shunt wire 136, as shown in FIG. 1B, to the stationary contact member 136A of the switch 134 which has its moveable contact member connected integrally to wire terminal 48.

As shown in FIGS. 11A-11C, the distal housing 42 of module 30 has opposing side surfaces 52C and 54C, respectively, which comprise aligned component parts of the module side surfaces 52 and 54, respectively, shown in FIGS. 1A-1E. Housing 42 also has opposing end surfaces, 56C and 58C, respectively, which comprise aligned component parts of the module end surfaces 56 and 58, respectively, shown in FIGS. 1B-1E. The end surface 58C has protruding integrally therefrom the collar 86 which, as shown in FIG. 1A, encircles the entrance end of bore 90 disposed longitudinally in housing 42 adjacent the distal surface 80 thereof. Surface 80 comprises the attitude control surface of module 30 having protruding integrally therefrom the movement-restricting stubs 82 and 83, respectively.

The housing 42 has opposing the distal surface 80 the proximal surface 66 which, as shown in FIG. 1B and 1E, mates with the distal surface 65 of housing 40. Proximal mating surface 66 of housing 42 has disposed in its axial central portion, as shown in FIG. 1A, the channel 74 which interlockingly receives ridge 73 protruding integrally from distal mating surface 65 of housing 40 to prevent relative lateral movement of the respective housings 40 and 42. Also, the proximal mating surface 66 has disposed in opposing marginal portions thereof the keyways 77 and 78 which, as shown in FIGS. 1B and 1E, are suitably located for interlockingly receiving the respective keys 75 and 76 to prevent relative longitudinal movement of the housings 40 and 42. Moreover, the proximal mating surface 66 of housing 42 disposed in its marginal portion adjacent side surface 54C a notch 184 and in its marginal portion adjacent side surface 52C axially spaced notches, 185 and 186, respectively. As shown more clearly in FIG. 12D, the notch 184 and the keyway 78 extend from the side surface 54C of housing 42 into communication with the central channel 74 axially disposed in surface 66. Also, the respective notches 185 and 186 as well as the keyway 77 extend from the side surface 52C of housing 40 into communication with the central channel 74.

In the further fabrication of module 30, the assembled electrical jack 34 has mated to the distal surface 65 of housing 40 the proximal surface 66 of housing 42 prior to the assembly of electrical jack 36. Accordingly, as shown in FIG. 1E, when the proximal surface 66 of housing 42 is mated with the distal surface 65 of housing 40, the notch 184 in surface 65 is aligned with the previously assembled spring wire 178 to avoid interference with the bight portion thereof extended over the surface 65, as described. Also, as shown in FIG. 1B, when the proximal surface 66 of housing 42 is mated with the distal surface 65 of housing 40, the notch 185 is aligned with the groove 109B and the adjacent ramp-like portion 165 of side surface 52C. Moreover, the notch 186 is aligned the previously assembled spring wire 182 to avoid interference with the bight portion thereof extended over the surface 65, as described.

Referring again to FIGS. 11A-11C, there is disposed in the longitudinal side surface 52C a plurality of mutually spaced and substantially parallel grooves 104C, 158C, 106C, 107C, and 162C, respectively. The grooves 104C, 158C, 107C and 162C in side surface 52C have respective depths conforming to the depths of relatively shallow grooves 104B, 158B, 107B and 162B, respectively, in the side surface 52B shown in FIG. 7A and serve as respective extensions thereof as may be seen in FIG. 1B. Also, the groove 106C in side surface 52C has a depth conforming to the depth of relatively deep groove 106B in the side surface 52B shown in FIG. 7A and serves as an extension thereof as may be seen in FIG. 1B. Accordingly, the end portions of respective grooves 104C, 158C, 107C and 162C adjacent the distal surface 80 are sufficiently shallow in side surface 52C to avoid any penetration into bore 90 in housing 42. On the other hand, the groove 106C is sufficiently deep in side surface 52C that its end portion adjacent distal surface 80 penetrates into and communicates with the bore 90 in housing 42.

The grooves 104C and 158C extend from the notch 186 and the proximal surface 66, respectively, to the distal surface 80 where they terminate adjacent respective opposing rounded shoulders 188 and 189 at one end portion of a groove 190 extending across the distal surface 80. Between the respective grooves 104C and 158C, the side surface 52C has a ramp-like portion 192 which slopes outwardly from a portion of distal surface 80 adjacent the respective rounded shoulders 188 and 189 to terminate substantially flush with the side surface 52C adjacent the proximal surface 66 of housing 42, as may be seen more clearly in FIG. 13B. The grooves 106C, 107C and 162C also extend from the proximal surface 66 to the distal surface 80 of housing 42. At the distal surface 80, the groove 162C terminates adjacent a rounded shoulder 193 at one end portion of a groove 194 extending across the distal surface 80. Between the respective grooves 107C and 162C, the side surface 52C has a ramp-like portion 196 which slopes outwardly from a portion of distal surface 80 adjacent rounded shoulder 193 to terminate substantially flush with side surface 52B adjacent the proximal surface 66 of housing 42.

Disposed in the longitudinal side surface 54C of housing 42 is a plurality of mutually spaced and substantially parallel grooves 120C, 122C, 172C and 124C, respectively. The grooves 122C and 172C in side surface 54C have respective depths conforming to the depths of relatively shallow grooves 122B and 172B, respectively, in the side surface 54B shown in FIG. 7C and serve as respective extensions thereof as may be seen in FIG. 1E. Also, the grooves 120C and 124C have respective depths conforming to the depths of relatively deep grooves 120B and 124B, respectively, in side surface 54B shown in FIG. 7C and serve as respective extensions thereof as may be seen in FIG. 1E. Accordingly, the end portions of respective grooves 122C and 172C adjacent the distal surface 80 are sufficiently shallow in side surface 52C to avoid any penetration into bore 90 in housing 42. On the other hand, the grooves 120C and 124C are sufficiently deep in side surface 54C that their respective end portions adjacent distal surface 80 penetrate into and communicate with the bore 90 in housing 42.

The grooves 122C and 172C extend from the notch 184 and the proximal surface 66, respectively, to the distal surface 80 where they terminate adjacent respective opposing rounded shoulders 197 and 198 at one end portion of a groove 200 extending across the distal surface 80 into communication with the relatively deep groove 106C in side surface 52C. Between the respective grooves 122C and 172C, the side surface 54C has a ramp-like portion 202 which slopes outwardly from a portion of distal surface 80 adjacent the respective rounded shoulders 197 and 198 to terminate substantially flush with side surface 54C adjacent the proximal surface 66 of housing 42, as may be seen more clearly in FIG. 13A. At the distal surface 80 of housing 42, the relatively deep grooves 120C and 124C in side surface 54C communicate with respective grooves 194 and 190 extending across the surface 80.

As shown in FIGS. 12A-12C, there is disposed in the side surface 52C of housing 42 a moveable contact member 204A comprising a resiliently flexible end portion of a pre-shaped spring wire 204 made of suitable resilient material, such as beryllium copper, for example. As shown more clearly in FIG. 13A, the moveable contact member 204A extends chordally through the bore 90 to the distal surface 80 of housing 42 where it is integrally joined to a bight portion 204B of wire 204 extending through the groove 200. The bight portion 204B is provided with a coplanar right-angle bend for extending around the shoulder 198 and along a marginal portion of surface 80 aligned with the ramp-like portion 202 of side surface 54B. The bight portion 204B is integrally joined to an orthogonal elbow portion 204C of wire 204 extending through the groove 172C and beyond the proximal surface 66 of housing 42.

A comparison of FIG. 1E with FIG. 8C shows that the elbow portion 204C of wire 204 is press-fitted into respective communicating grooves 172B and 171 in side surface 54B shown in FIG. 7C, and is integrally joined to a leg portion 204D of wire 204 which is press-fitted into groove 122B and extends beyond the proximal surface 64 of housing 40. A further comparison of FIG. 1E with 4C shows that the leg portion 204D is press-fitted into groove 122A in side surface 54A and extends to terminal surface 44 of housing 38 where it is integrally joined to wire terminal 49. Thus, the wire terminal 49 is electrically connected through the described integral portions of spring wire 204 to the moveable contact member 204A within groove 106C in side surface 52C of housing 42 and extended through the bore 90.

Referring again to FIGS. 12A-12C, there is disposed in side surface 54C a moveable contact member 206A comprising a resiliently flexible end portion of a pre-shaped spring wire 206 made of suitable resilient material, such as beryllium copper, for example. As shown in FIG. 13B, the moveable contact member 206A extends chordally through bore 90 to the distal surface 80 of housing 42 where it is integrally joined to a bight portion 206B of wire 206 extending through the groove 190. The bight portion 206B has a coplanar right-angle bend for extending around the shoulder 188 (FIG. 11B) and along a marginal portion of distal surface 80 aligned with the ramp-like portion 192 of side surface 52C. Bight portion 206B is integrally joined to an elbow portion 206C of wire 206 extending through the groove 158C in side surface 52C and beyond the proximal surface 66 of housing 42.

A comparison of FIG. 1B with FIG. 8A shows that the elbow portion 206C of wire 206 is press-fitted into respective communicating grooves 158B and 157 in side surface 52B and is integrally joined to a leg portion 206D of wire 206 which is press-fitted into groove 104B and extends beyond the proximal surface 64 of housing 40. A further comparison of FIG. 1B with FIG. 4A shows that the leg portion 206D is press-fitted into groove 104A in side surface 52A and extends to the terminal surface 44 of housing 38 where it is integrally joined to wire terminal 46. Thus, the wire terminal 46 is electrically connected through the described integral portions of spring wire 206 to the moveable contact member 206A within groove 124C in side surface 54C of housing 42 and extended through the bore 90.

In this instance, it is not required that the electrical jack plug 92 shown in FIG. 2 have its cyclindrical body 93 slidably inserted into bore 90 in housing 42 prior to the installation of spring wires 204 and 206, respectively. Accordingly, the pre-shaped spring wire 204 is held above the distal surface 80 of housing 42 such that the leg portion 204D thereof is insertable into the groove 122C in side surface 54C and the moveable contact member 204A is aligned for insertion into the groove 106C in side surface 52C of housing 42. Then, the bight portion 204B is pressed toward the distal surface 80 of housing 42 thereby causing the leg portion 204D to move along the substantially aligned grooves 122C, 122B and 122A in respective side surfaces 52C, 52B and 52A. As a result, the elbow portion 204C rides up the ramp-like portion 202 of side surface 54C and onto the plateau-like portion 174 of side surface 54B (FIG. 8C), and the moveable contact member 204A enters the groove 106C in side surface 52C of housing 42. When the bight portion 204B is press-fitted into groove 200 in distal surface 80 of housing 42, the moveable contact member 204A is extended chordally through the bore 90 and is positioned for resilient flexible movement in groove 106C. Also, the elbow portion 204C, after snapping over the plateau-like portion 174 of side surface 54B, is press-fitted into the communicating grooves 172B and 171B (FIG. 8C), respectively, in side surface 52B. Moreover, the leg portion 204D is press-fitted into substantially aligned grooves 122B and 122A in side surfaces 52B and 52A, respectively, as shown in FIG. 1E. As a result, the wire terminal 49 extends the desired distance from terminal surface 44 of housing 38. The pre-shaped spring wire 206 is installed in a similar manner to position the moveable contact member 206A within groove 124C in side surface 54C when the bight portion 206B of spring wire 206 is press-fitted into groove 190 in distal surface 80 of housing 42.

Referring to FIGS. 14A and 14B, it may be seen that the respective moveable contact members 204 and 206 are operable by means of the electrical jack plug 92 shown in FIG. 2 having the cylindrical body 93 thereof slidably inserted into the bore 90 in housing 42. As a result, the electrically conductive tip portion 100 and ring portion 98 of body 93 are brought into interference engagement with the moveable contact member 206A and the moveable contact member 204A, respectively. Consequently, within the groove 106C, the moveable contact member 204A is flexed resiliently outward toward the side surface 52C without protruding therefrom. Also, within the groove 124C, the moveable contact member 206A is flexed resiliently outward toward the side surface 54C without protruding therefrom. However, by virtue of the resilient wire materials, the moveable contact members 204A and 206A are maintained in biased electrical engagement with the ring portion 98 and the tip portion 100, respectively, of the cylindrical body 93 of electrical jack plug 92. Thus, the ring portion 98 and the tip portion 100 of the body 100 are electrically connected through the integral portions of the pre-shaped spring wires 204 and 206, respectively, to the wire terminals 49 and 46, respectively, extending from the terminal surface 44 of module 30.

Referring to FIGS. 1A-1E, it may be seen that the substantially aligned grooves 120A, 120B and 120C, respectively, which are unoccupied in the described embodiment, may be utilized for disposing therein respective moveable contact members (not shown) which may be similar to the moveable contact members 204A and 206A, for example, and contact electrically the conductive sleeve 96 of electrical jack plug 92 shown in FIG. 2. These sleeve contacting members (not shown) may comprise integral end portions of respective pre-shaped spring wires which extend chordally through the respective bores 88, 89 and 90 for interference electrical engagement with the conductive sleeve 98 when the body 93 of jack plug 92 is inserted slidably into the respective bore. Also, these sleeve contacting members (not shown) may be electrically connected through integral bight, elbow and leg portions of the respective pre-shaped spring wires to integral wire terminals extending from respective portions of the terminal surface 44 aligned with the grooves 107A, 108A and 109A, respectively, in side surface 52 of module 30. Thus, the module 30 may be provided with other grooves than those illustrated and may have disposed therein respective spring wires which are pre-shaped differently from the spring wires shown and described herein.

In FIGS. 15 and 16, there is shown a jackfield assembly 210 including a generally rectangular, printed circuit board 212 comprising a dielectric substrate having opposing extended surfaces, 214 and 216, respectively, which are provided with respective pluralities 218 and 220 of mutually spaced, printed circuit conductors. The pluralities 218 and 220 of printed circuit conductors are disposed on the respective surfaces 214 and 216 by conventional printed circuit techniques. Printed circuit board 212 may be supported within an opening defined by a conformingly shaped frame 222 including a stamped metal member provided with a longitudinal rear panel 224 having opposing end portions joined integrally to respective orthogonal end panels 225 and 226. The panels 224-226 have respective edge portions adjacent the surface 214 of board 212 bent orthogonally to extend inwardly of frame 222 and form three sides of a rim 228 to which spaced marginal portions of the board 212 may be secured, as by respective fastening means 230, for example. Also, the panels 224-226 may have respective opposing edge portions similarly bent orthogonally to extend inwardly of frame 222 to form three sides of a rim 232 in spaced opposing relationship with the rim 228.

Extending through the rear panel 224 of frame 222 is a linear series of conventional feed-through connectors 232, 233, 234 and 235, respectively, which are laterally spaced apart. Each of the feed-through connectors 232-235 includes a respective plurality of mutually spaced terminal pins 240 extending insulatingly through a dielectric body of the connector. The dielectric bodies of the connectors 232-235 may be fastened to the inner surface of rear panel 224 by suitable means, such as screws 241, for example, and may be fastened to the printed circuit board 212 by conventional fastening means 243. Each of the terminal pins 240 in the respective connectors 232-235 is disposed for electrical connection to a respective printed circuit conductor on one of the extended surfaces 214 and 216, respectively, of printed circuit board 212.

The end panels 225 and 226 of frame 222 have their terminal end portions bent orthogonally outward of frame 222 to form respective mounting flanges 242 and 244. Secured to the flanges 242 and 244, as by screws 246, for example, are respective opposing end portions of a rigid front panel 248 forming a fourth side of the frame 222 and extending along a longitudinal marginal portion of printed circuit board 212. Front panel 248 also has opposing longitudinal edge portions disposed orthogonally of panel 248 to protrude inwardly of frame 222 and form fourth sides of respective rims 228 and 232 extending over the adjacent longitudinal marginal portion of board 212. The surface 216 of board 212 has disposed on the longitudinal marginal portion adjacent front panel 248 a linear array of similarly oriented modules 30 which are laterally spaced apart.

Each of the modules 30 in array 250 is aligned with a respective transverse portion of front panel 248 having therein a plurality of through-holes 251, 252 and 253 which are located and sized for slidably receiving collars 84, 85 and 86, respectively, protruding from the adjacent end surface of the aligned module 30. Accordingly, the front panel 248 is brought into interfacing relationship with the adjacent end surfaces of the respective modules 30 in array 250 such that the respective collars 84, 85 and 86 protruding from each of the adjacent end surfaces of the respective modules 30 extend through the aligned holes 251, 252 and 253, respectively, in front panel 248. As a result, the electrical jack plug 92 shown in FIG. 2 may have its cylindrical body 93 readily inserted through any one of the respective collars 84, 85 and 86 and into the aligned bores 88, 89 and 90, respectively, of a selected module 30. Thus, without the need of respective fastening hardware, the modules 30 of array 250 are interconnected mechanically to one another through the front panel 248 and also are connected through the rigid front panel 248 to the frame 222 which has secured thereto, as by fastening means 230, for example, the printed circuit board 212.

Spanning the attitude control surfaces 80 of the laterally spaced modules 30 in array 250 is a module interlocking strip 254 made, as by stamping, for example, from suitably rigid material which preferably is dielectric, such as a thermoset plastic material, for example. The interlocking strip 254 extends the entire length of array 250 and has aligned with each of the modules 30 a respective transverse portion provided with mutually spaced, through-holes, 256 and 258, respectively. The holes 256 and 258 are suitably located in strip 254 and sized for press-fitting over the movement-restricting stubs 82 and 83, respectively, which protrude integrally from the attitude control surfaces 80 of modules 30. Accordingly, the module interlocking strip 254 is pressed into interfacing relationship with the attitude control surfaces 80 of the respective modules 30 in array 250. Preferably, the strip 254 has a thickness greater than the extensions of stubs 82 and 83 from the respective attitude control surfaces 80 so that the stubs 82 and 83 do not protrude from the interlocking strip 254. The interlocking strip 254 is spaced from the adjacent portions of rim 230 and preferably is not secured to any part of frame 222 for purposes of ease in removing the strip 254 during repair procedures, such as when one of the modules 30 in array 250 requires replacement, for example. Thus, without the need of respective fastening hardware, the modules 30 are interconnected to one another through the module interlocking strip 254 which is simply installed by pressing it over the respective stubs 82 and 83 and onto the attitude control surfaces 80 of the respective modules 30 in array 250.

Figure 17:
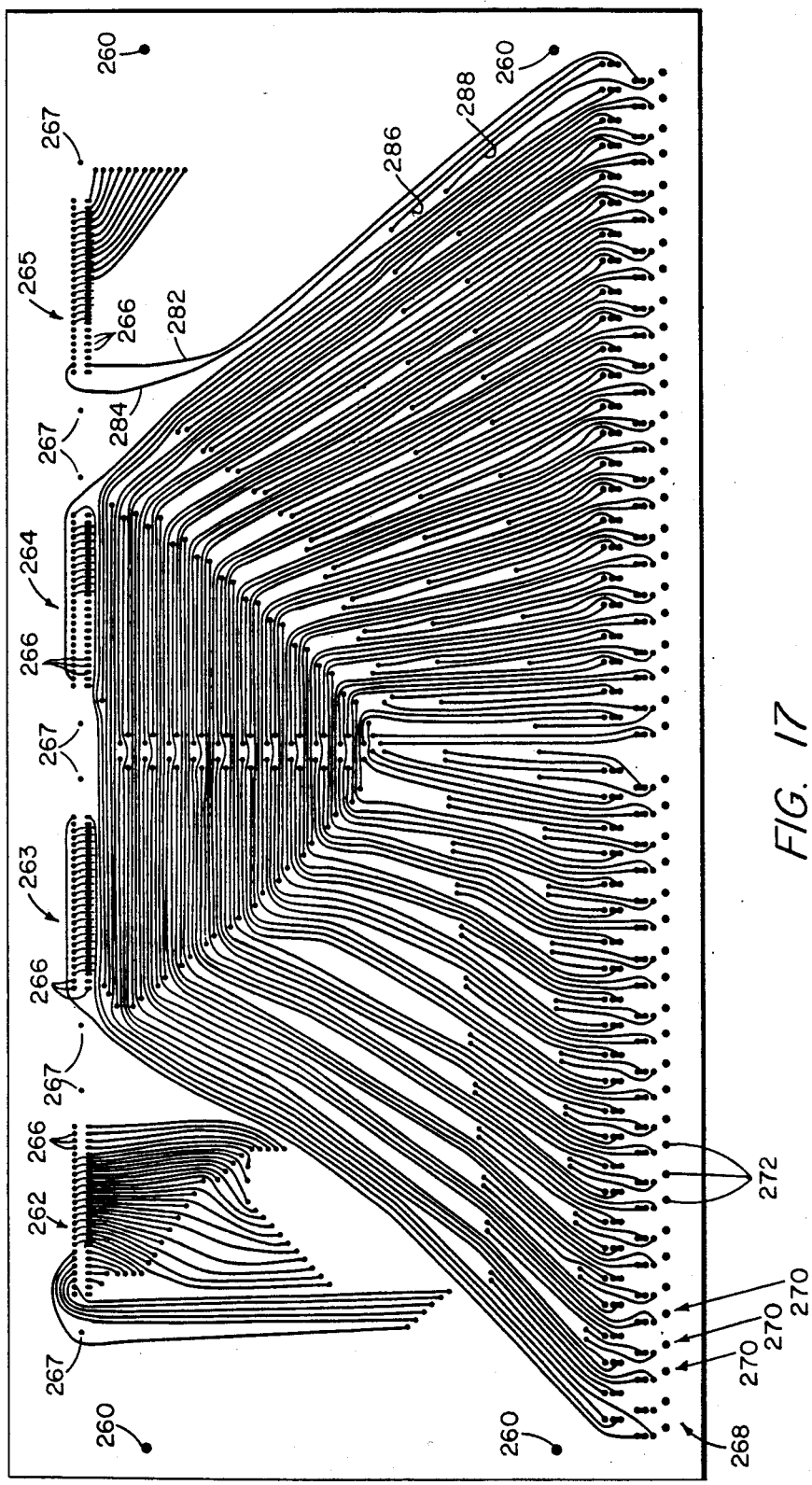
FIG. 17 is a plan view of the printed circuit board surface shown in FIG. 15.
Figure 18:
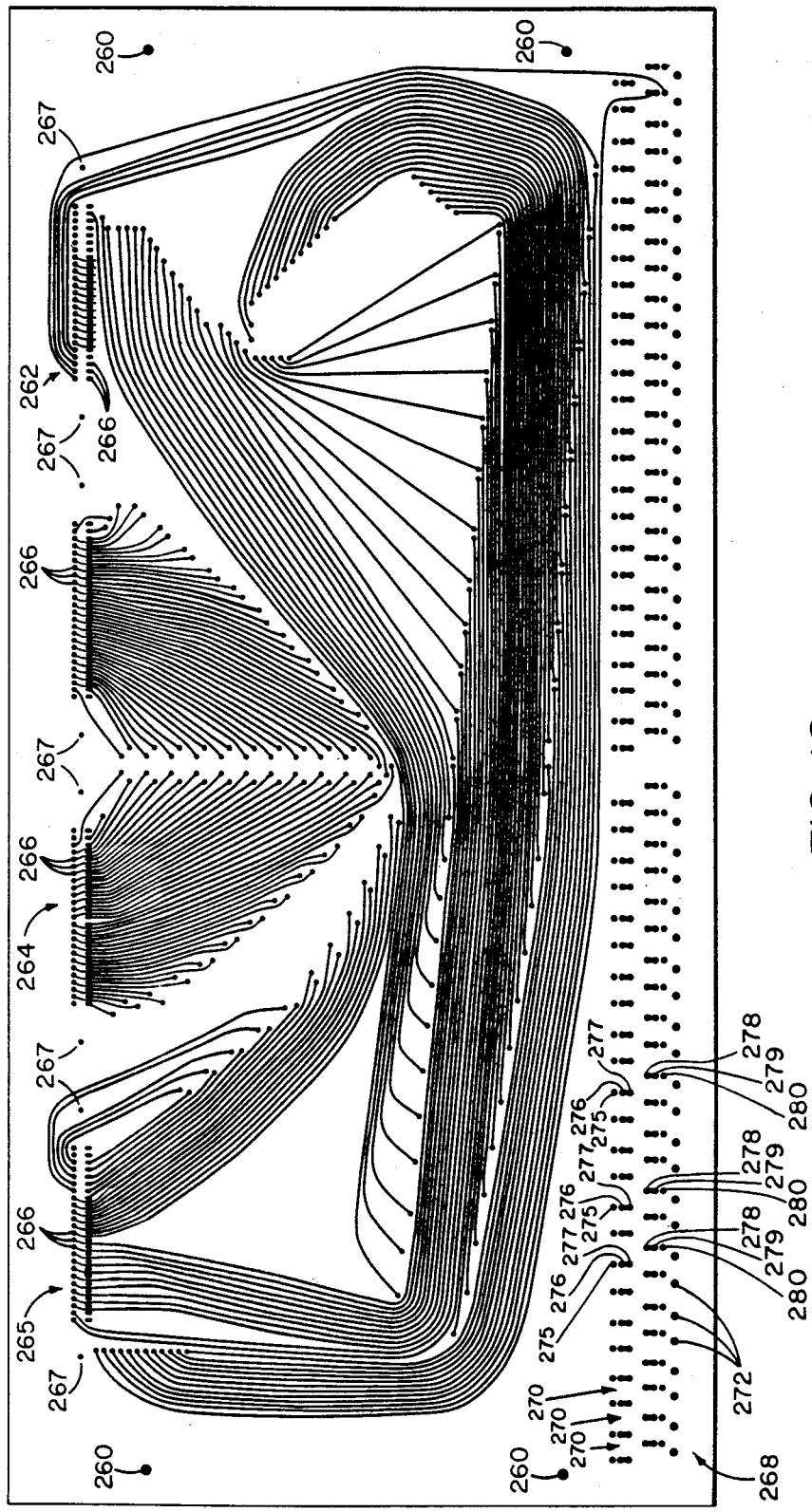
FIG. 18 is a plan view of the printed circuit board surface shown in FIG. 16.
Figure 22:
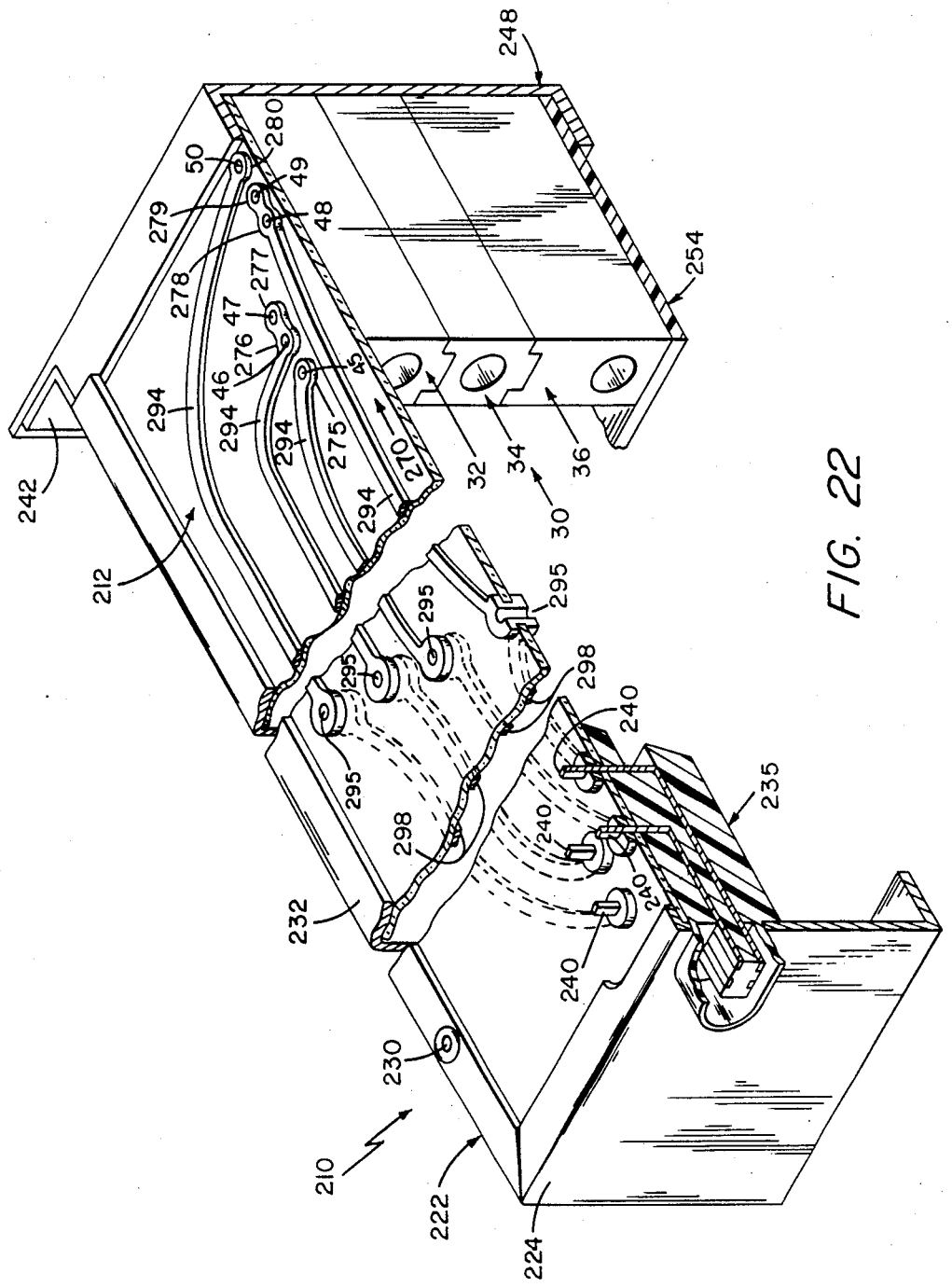
FIG. 22 is a fragmentary isometric view showing typical electrical connections made by the conductors on the printed circuit board between the terminals of a module and the terminals of a feed-through connector.

As shown in FIGS. 17 and 18, the surfaces 214 and 216 of printed circuit board 212 are provided with respective high density pluralities 218 and 220 of printed circuit conductors which are insulatingly spaced from one another. Opposing end portions of the board 212 may be provided with respective pairs of spaced apart through-holes 260 which do not require plating since they are located to receive therein respective fastening means 230 for securing the board 212 to adjacent end portions of the rim 228, as shown in FIG. 15. The longitudinal marginal portion of board 212 adapted for disposal adjacent rear panel 224, as shown in FIGS. 15 and 16, is provided with a linear series of apertured areas 262, 263, 264 and 265, respectively, which are laterally spaced apart in conformity with the linear series of feed-through connectors 232, 233, 234 and 235, respectively, shown in FIG. 16.

Each of the apertured areas 262-265 is disposed between a respective pair of spaced through-holes 267 located in the board 212 of receiving therein respective fastening means 243 for securing the dielectric bodies of the respective feed-through connectors 232-235 to the printed circuit board 212. Between the respective pairs of spaced through-holes 267, the apertured areas 262-265 comprise two uniformly spaced rows of mutually spaced through-apertures 266 which are disposed for receiving therein respective terminal pins 240 extended from the dielectric bodies of feed-through connectors 232-235, respectively, shown in FIG. 16. The through-apertures 266 are plated and have resulting diameters which are sufficiently larger than the diameter of the received terminal pin 240 to permit a fillet of solder to be disposed therebetween, as by wave-soldering, for example.

The longitudinal marginal portion of board 212 adapted to be disposed adjacent the front panel 248, as shown in FIG. 16, is provided with a linear array 268 of apertured areas 270 conforming to the linear array 250 of modules 30 shown in FIG. 16. Each of the apertured areas 270 includes a through-hole 272 which is suitably located for receiving therein the orientation post 62 protruding from the terminal surface 44 of module 30 shown in FIGS. 1A-1E. Since each of the through-holes 272 in the respective apertured areas 270 are disposed in registration with one another along the linear array 267, the orientation posts 62 disposed in the respective through-holes 272 ensure that all of the modules 30 in the linear array 250 will be similarly oriented.

Also, each of the apertured areas 270 comprises a predetermined pattern of through-apertures 275, 276, 277, 278, 279 and 280, respectively, conforming to the predetermined pattern of respective wire terminals 45-50 protruding from the terminal surface 44 of module 30 shown in FIGS. 1A-1E. Each of the through-apertures 275-280 in the respective apertured areas 270 of array 268 are plated and have resulting diameters sufficiently larger than the diameters of respective wire terminals 45-50 to permit a fillet of solder to be disposed therebetween, as by wave-soldering, for example. Thus, the printed circuit board 212 functions to interconnect the modules 30 in array 250 to one another and to the jackfield assembly 210 without the need of respective fastening hardware.

Moreover, in each of the apertured areas 270, the respective through-apertures 275-277 form a first linear group and the respective through-apertures 278-280 form a second linear group which are spaced axially and transversely from one another. In each of the apertured areas 270, the respective through-apertures 276 and 277 are electrically connected to one another within the first linear group by printed circuit conductor means. Also, in each of the apertured areas 270, the respective through-apertures 278 and 279 are electrically connected to one another within the second linear group by printed circuit conductor means. The mutually connected through-apertures 276 and 277 in each of the first groups in the respective apertured areas 270 are electrically connected through a common printed circuit conductor, such as conductor 282 shown in FIG. 17, for example, to the same through-aperture 266 disposed for receiving therein a terminal pin 240. Also, the mutually connected through-apertures 278 and 279 in the second groups in the respective apertured areas 270 are electrically connected through a common printed circuit conductor, such as 284 shown in FIG. 17, for example, to the same through-aperture 266 disposed for receiving therein a terminal pin 240. The through-apertures 275 in the first linear groups and the through-apertures 280 in the second linear groups in each of the apertured areas 270 are connected electrically through respective printed circuit conductors, such as 286 and 288, respectively, shown in FIG. 17, for example, to respective through-apertures 266.

In assembly, each of the modules 30 in array 250 is mounted on the surface 216 of board 212, as shown in FIG. 16, by having its orientation post 62 inserted into the through-hole 272 and its wire terminals 45-50 inserted into respective through-apertures 275-280 of an apertured area 270. As a result, the spacing bosses 60 and 61 protruding from the terminal surfaces 44 of the modules 30, as shown in FIGS. 1A-1E, are brought into contacting relationship with the surface 216 of board 212. Then, the module interlocking strip 254 is assembled by having the through-holes 256 and 258 therein press-fitted over the respective movement-restricting stubs 82 and 83 and bringing the strip 254 into interfacing relationship with the respective attitude control surfaces 80 of the modules 30 in array 250.

The resulting sub-assembly is clamped and passed through a wave-soldering bath in a well-known manner. As shown in FIG. 19, after emerging from the wave-soldering bath, the wire terminals 45-50 of each of the modules 30 in array 250 are secured by interposed fillets of solder to the plated through-apertures 275-280, respectively, in an apertured area 270 of board 212. Also, the wire terminals 46-47 of each of the modules 30 are interconnected by the respective through-apertures 276-277 being soldered to one another; and the wire terminals 48-49 of each of the modules 30 are interconnected by the respective through-apertures 278-279 being soldered to one another.

Accordingly, as shown schematically in FIG. 20, each of the modules 30 in array 250 has an electrical jack 32 with a moveable contact member 144A connected electrically through the "tip" shunt wire 142 to the moveable contact member 182A in electrical jack 34 shown in FIGS. 1B and 1E. Also, each of the modules 30 has an electrical jack 32 with a moveable contact member 138A connected electrically through the "ring" shunt wire 136 to the moveable contact member 178A in electrical jack 34. Moreover, the moveable contact member 144A in electrical jack 32 is connected electrically through its wire terminal 47, which is soldered to wire terminal 46, to the moveable contact member 206A in electrical jack 36. Futhermore, the moveable contact member 138A in electrical jack 32 is connected electrically through its wire terminal 48, which is soldered to wire terminal 49, to the moveable contact member 204A in electrical jack 36. The wire terminals 45, 46 which is soldered to 47, 48 which is soldered to 49 and 50 are electrically connected through respective printed circuit conductors, such as 286, 284, 282 and 288 shown in FIG. 17, for example, to respective terminal pins 240 which are soldered into the respective through-apertures 266 during the wave soldering operation. The terminal pins 240 connected electrically to wire terminals 47 and 48 are disposed for electrical connection to input terminals of respective electrical loads 286 and 288 which are disposed externally of the jackfield assembly 210. The output terminals of electrical loads 286 and 288 are connected electrically through respective terminal pins 240 and respective connecting printed circuit conductors to the wire terminals 45 and 50 of the electrical jack 34.

After the wave-soldering operation, the front panel 248 is installed by having the plurality of through-holes 251, 252 and 253 in respective transverse portions thereon passed slidably over collar 84, 85 and 86, respectively, protruding from the adjacent end surfaces 58 of the modules 30. As a result, the front panel 248 is brought into interfacing relationship with the end surfaces 58 of the respective modules 30 in array 250, as shown in FIG. 16. Then, the printed circuit board 212 is inserted into the open side of the three-sided member comprising rear panel 224 and respective end panels 225 and 226. The front panel 248 has its opposing end portions brought into abutting relationship with the respective flanges 242 and 244 and secured thereto, as by screws 246, for example.

The feed-through connectors 232-235 have their respective dielectric bodies, which are secured to the board 212 by conventional fastening means 243 prior to the wave-soldering operation, secured to the inner surface of rear panel 224, as by screws 241, for example. The printed circuit board has opposing end portions secured in spaced relationship with respective adjacent end portions of the rim 228 by fastening means 230. As shown in FIG. 21, each of the fastening means 230 may comprise a respective machine screw 292 passed through a hole in rim 228 and through a spacer washer 296 which may be made of electrically conductive or of dielectric material, as desired. The screw 292 then is passed through one of the holes 260 in board 212 shown in FIGS. 17-18, and is engaged by a conventional nut 293 which is tightened to secure the board 212 in predetermined spaced relationship with the rim 228 of frame 222.

As shown in FIG. 21, when fully assembled, the jackfield assembly 210 includes a module 30 having respective wire terminals 45-50 soldered into respective through apertures 275-280 in an apertured area 270 of printed circuit board 212. The wire terminals 45-47 in respective through-apertures 275-277 form a first linear group wherein the wire terminals 46-47 and the respective through-apertures 276-277 are electrically connected to one another. Also, the wire terminals 48-50 in respective through-apertures 278-280 form a second linear group wherein the wire terminals 48-49 and the respective through-apertures 278-279 are electrically connected to one another. The wire terminals 45, 46 which is connected to 47, 48 which is connected to 49 and 50 are connected electrically to respective printed circuit conductors 294 which may be connected through a respective eyelet 295 of electrically conductive material extending through the thickness of board 212 to connect electrically to a respective printed circuit conductor 298 disposed on the opposing surface of board 212. The respective printed circuit conductors 298 may be electrially connected to respective terminal pins 240 extending insulatingly through a dielectric body of feedthrough connector, such as 235, for example, for external connection to electrical loads (not shown).

Thus, the jackfield assembly 210 has a first interconnecting means comprising printed circuit board 212 for connecting the respective modules 30 in array 250 electrically and mechanically into the assembly. The first interconnecting means cooperates with a first restraining means of the modules 30 comprising the integrally protruding orientation posts 62 for preventing damage to the respective soldered wire terminals 45-50 when insertion or withdrawal of the electrical jack plug 92 shown in FIG. 2 exerts a laterally directed force on a module 30. Also, the jackfield assembly 210 has a second interconnecting means comprising the module interlocking strip 254 for engaging a second restraining means of the modules 30 comprising the integrally protruding movement-restricting stubs 82 and 83, respectively, for preventing rotational or rocking movement of a module 30 relative to the other modules 30 in array 250. Moreover, the jackfield assembly 210 has a third interconnecting means comprising the front panel 248 for engaging a third restraining means of the modules 30 comprising the integrally protruding collars 84, 85 and 86, respectively, for preventing lifting movement of a module 30 relative to the other modules 30 in array 250 and relative to the printed circuit board 212.

Also, there has been disclosed herein a jack module 30 comprising a vertically stacked array of electrical jacks 32, 34 and 36 having respective dielectric housings oriented similarly and interfitted with one another to form a slab-like body having a uni-structural appearance. Disposed in a longitudinal side wall surface of the module is a pair of electrical switches having respective stationary contact members integrally joined to one another through an electrically conductive, shunt wire. The shunt wire is pre-shaped for press-fitting it into communicating grooves provided in the longitudinal side surface of the module. As a result, the shunt wire is embedded in the dielectric material of the longitudinal side surface with sufficient snugness for providing the necessary frictional engagement to hold the shunt wire firmly in place even during operation of the electrical switch. Accordingly, it should be noted that the electrical shunt wire is a single integral member and is installed by a simple press-fitting operation without requiring other types of fastening operations, such as soldering or welding, for example. Also, it should be noted that the integral shunt wire interconnects two stationary contact members of respective electrical switches without need of additional wire terminals and interconnecting conductors. As a result, it is possible to provide the respective surfaces 214 and 216 of board 212 shown in FIGS. 17 and 18 with respective high density pluralities 218 and 220, respectively, of printed circuit conductors which are insulatingly spaced from one another.

From the foregoing, it will be apparent that all of the objectives have been achieved by the structures shown and described herein. It also will be apparent, however, that various changes may be made by those skilled in the art without departing from the spirit of the invention as expressed in the appended claims. It is to be understood, therfore, that all matter shown and described is to be interpreted as illustrative and not in a limiting sense.

What is claimed is:

1. A jackfield assembly comprising:
  module interconnecting means including a printed circuit board having an array of apertured areas provided with respective patterns of through-apertures and printed circuit means disposed on at least one surface of the board for making electrical connections to said through-apertures; and
  an array of electrical jack modules conforming to the array of apertured areas, each of the modules including a stacked series of electrical jacks having respective body means provided with respective open-ended bores for receiving therein an electrical jack plug,
  each of the modules having aligned with a respective one of said apertured areas of proximal surface having protruding therefrom wire terminal means for extending through the predetermined pattern of through-apertures in the aligned apertured area and electrically connecting to said printed circuit means,
  the body means of each of the electrical jacks in said stacked series including respective external side surfaces of dielectric material disposed substantially orthogonal to said proximal surface of the module and provided with respective recess means for receiving therein electrical conductors and with respective electrical switches disposed within the recess means in said external side surfaces, each of said switches comprising a pair of first and second contact members and
  electrical shunt means disposed within the recess means in said external side surfaces of two electrical jacks in each of said stacked series and integrally connected to the respective first contact members of said electrical switches therein for electrically connecting the respective first contact members directly on the module and simplifying the electrical connections required of the printed circuit means.

2. The jackfield assembly as set forth in claim 1 wherein each of said modules includes a distal surface provided with a plurality of mutually spaced stubs protruding from the distal surface, and said module interconnecting means includes a strip of rigid material extended the length of the array of modules and having respective transverse portions wherein mutually spaced through-holes are press-fitted over respective stubs protruding from a distal surface of an aligned module in the array.

3. A jackfield assembly as set forth in claim 2 wherein each of said modules includes an end surface disposed orthogonally to said proximal surface and provided with a plurality of mutually spaced collars protruding from said end surface, and said module interconnecting means includes a rigid panel extended along said end surface of the modules and having respective aligned transverse portions provided with a plurality of mutually spaced through-holes slidably pressed over respective collars protruding from the end surface of said aligned module in the array.

4. A jackfield assembly as set forth in claim 3 wherein said module interconnecting means includes a plurality of mutually spaced connectors, each having a respective plurality of mutually spaced terminal pins connected electrically through said printed circuit means to respective wire terminals extended through said through-apertures in said apertured areas of said printed circuit board.

* * * * *